United States Patent
Zhang et al.

(10) Patent No.: US 12,245,507 B2
(45) Date of Patent: Mar. 4, 2025

(54) AEROSOL JET PRINTING AND SINTERING OF THERMOELECTRIC DEVICES

(71) Applicant: UNIVERSITY OF NOTRE DAME DU LAC, South Bend, IN (US)

(72) Inventors: Yanliang Zhang, South Bend, IN (US); Mortaza Saeidi-Javash, South Bend, IN (US)

(73) Assignee: UNIVERSITY OF NOTRE DAME DU LAC, South Bend, IN (US)

( * ) Notice: Subject to any disclaimer, the term of this patent is extended or adjusted under 35 U.S.C. 154(b) by 334 days.

(21) Appl. No.: 17/609,159

(22) PCT Filed: Jun. 8, 2020

(86) PCT No.: PCT/US2020/036609
§ 371 (c)(1),
(2) Date: Nov. 5, 2021

(87) PCT Pub. No.: WO2020/247915
PCT Pub. Date: Dec. 10, 2020

(65) Prior Publication Data
US 2022/0209091 A1    Jun. 30, 2022

Related U.S. Application Data

(60) Provisional application No. 62/887,845, filed on Aug. 16, 2019, provisional application No. 62/862,515, (Continued)

(51) Int. Cl.
*H10N 10/852*    (2023.01)
*C09D 7/40*    (2018.01)
(Continued)

(52) U.S. Cl.
CPC .............. *H10N 10/852* (2023.02); *C09D 7/61* (2018.01); *C09D 7/66* (2018.01); *C09D 11/322* (2013.01);
(Continued)

(58) Field of Classification Search
CPC ........ H10N 10/00; H10N 10/01; H10N 10/85; H10N 10/852; H10N 10/851; H10N 10/853
See application file for complete search history.

(56) References Cited

U.S. PATENT DOCUMENTS 6,274,802 B1    8/2001    Fukuda et al.
7,816,006 B2    10/2010    Yadav et al.
(Continued)

FOREIGN PATENT DOCUMENTS

EP    0369340 A1    5/1990
JP    2013175660 A    9/2013
(Continued)

OTHER PUBLICATIONS

Jo et al. ("Ink Processing for Thermoelectric Materials and Power Generating Devices"), Adv. Mater. 2019, 31, 1804930. First available Dec. 28, 2018.*
(Continued)

*Primary Examiner* — Christina Chern
(74) *Attorney, Agent, or Firm* — Workman Nydegger

(57) ABSTRACT

Methods, ink compositions, and 3D conformal printed flexible films. The method may include aerosol jet printing a thermoelectric ink composition, followed by photonic or other sintering of the ink to remove surfactant included therein, and to convert the thermoelectric nanoparticles of the ink composition into a dense structure capable of charge carrier transport. The ink compositions may be solution-processed semimetal-chalcogenides (e.g., Te containing
(Continued)

materials) in a suitable carrier (e.g., polyol(s), alcohol(s), etc.). A surfactant (e.g., PVP) may be present in the ink. Within seconds of photonic sintering, the electrical conductivity of the printed film is dramatically increased from non-conductive to a value on the order of at least $1 \times 10^4$ S/m. The films may demonstrate a room-temperature power factor of at least 500 $\mu Wm^{-1}K^{-2}$. The realized values of 730-2200 $\mu Wm^{-1}K^{-2}$ achieved are among the highest values reported for flexible thermoelectric films. The film is durable (e.g., 500 bending cycles with no significant performance drop).

37 Claims, 35 Drawing Sheets

Related U.S. Application Data filed on Jun. 17, 2019, provisional application No. 62/858,848, filed on Jun. 7, 2019.

(51) Int. Cl.
| | | |
|---|---|---|
| C09D 7/61 | (2018.01) | |
| C09D 11/322 | (2014.01) | |
| C09D 11/36 | (2014.01) | |
| C09D 11/38 | (2014.01) | |
| C09D 11/52 | (2014.01) | |
| H10N 10/01 | (2023.01) | |

(52) U.S. Cl.
CPC ............. *C09D 11/36* (2013.01); *C09D 11/38* (2013.01); *C09D 11/52* (2013.01); *H10N 10/01* (2023.02)

(56) References Cited

U.S. PATENT DOCUMENTS

| | | |
|---|---|---|
| 8,519,505 B2 | 8/2013 | Hiroshige et al. |
| 8,803,141 B2 | 8/2014 | Mitzi et al. |
| 9,299,905 B2 | 3/2016 | Kim et al. |
| 10,217,922 B2 | 2/2019 | Petkie |
| 10,283,357 B2 | 5/2019 | Dolzhnikov et al. |
| 2007/0034838 A1 | 2/2007 | Imaoka et al. |
| 2014/0035995 A1 | 2/2014 | Chou et al. |
| 2016/0104829 A1* | 4/2016 | Hayashi ............ H10N 10/17 136/203 |
| 2016/0172572 A1 | 6/2016 | Span et al. |
| 2019/0035996 A1* | 1/2019 | Chen ................ H10N 10/01 |

FOREIGN PATENT DOCUMENTS

| | | | | |
|---|---|---|---|---|
| KR | 10-1420022 | * | 7/2014 | ........... H01L 41/193 |
| WO | 2010071749 | | 6/2010 | |
| WO | 2017065306 | | 4/2017 | |
| WO | 2017156296 | | 9/2017 | |

OTHER PUBLICATIONS

Shah et al. ("Solution-Based Synthesis and Processing of Metal Chalcogenides for Thermoelectric Applications"), Appl. Sci. 2019, 9, 1511. Published Apr. 11, 2019.*
Shi et al. ("Hydrothermal synthesis and thermoelectric transport properties of Sb2Te3—Te heterogeneous nanostructures"), CrystEngComm, 2013, 15, 2978.*
English machine translation of Yoo et al. (KR 10 1420022), published Jul. 9, 2014.*
Park et al. ("High-performance shape-engineerable thermoelectric painting"); Nature Communications, 7, Article No. 13403 (2016).*
Ou et al. ("Fully Printed Organic-Inorganic Nanocomposites for Flexible Thermoelectric Applications"); ACS Appl. Mater. Interfaces 2018, 10, 23, 19580-19587.*
International Search Report and Written Opinion issued in PCT/US2020/036609 mailed Oct. 16, 2020.
Varghese, "Additive Manufacturing of High Performance Flexible Thermoelectric Generators Using Nanoparticle Inks" May 2019, p. 66, para. 2, p. 66, para. 1, p. 54, para 1, p. 53, para 2.
Dun, Chaochao et al, "Flexible thermoelectric fabrics based on self-assembled tellurium nanorods with a large power factor," Physical Chemistry Chemical Physics, Jan. 6, 2015, pp. 8591-8595.
Dun, Chaochao et al, "Layered Bi2Se3 nanoplate/polyvinylidene fluoride composite based n-type thermoelectric fabrics." ACS Applied Materials & Interfaces, Mar. 23, 2015, pp. 7054-7059.
Dun, Chaochao et al, "Flexible n-type thermoelectric films based on Cu-doped Bi2Se3 nanoplate and Polyvinylidene Fluoride composite with decoupled Seebeck coefficient and electrical conductivity." Nano Energy, Oct. 22, 2015, pp. 306-314, vol. 18.
Dun, Chaochao et al, "2D chalcogenide nanoplate assemblies for thermoelectric applications." Advanced Materials, Jan. 4, 2017, pp. 1-8.
Zhou, Chongjian et al, "Environmentally benign synthesis of high-quality, band gap-tunable, homogeneous Te/Se alloyed nanowires." RSC Advances 5.85, Jul. 31, 2015.
Dun, Chaochao et al, "Bi2Te3 Plates with Single Nanopore: The Formation of Surface Defects and Self-Repair Growth." Chemistry of Materials, Jan. 30, 2018, pp. 1965-1970, vol. 30.
Dun, Chaochao et al, "Topological doping effects in 2D chalcogenide thermoelectrics," 2D Materials, Feb. 7, 2018, pp. 1-8, vol. 5, Issue 4.
Dun, Chaochao et al, "Flexible Thermoelectric Fabrics Based on Layered Topological Insulator Bi2Se3 Nanoplates/Polyvinylidene Fluoride Composite," Bulletin of the American Physical Society, Nov. 14, 2014, pp. 1-19.
Dun, Chaochao, "Low-dimensional chalcogenide based thermoelectric composites," Wake Forest University, Doctoral Thesis, May 2017, pp. 1-175.
Sumithra, S. et al, "Enhancement in thermoelectric figure of merit in nanostructured Bi2Te3 with semimetal nanoinclusions," Advanced Energy Materials, Sep. 9, 2011, pp. 1141-1147, vol. 1.
Min, Yuho et al, "Surfactant-Free Scalable Synthesis of Bi2Te3 and Bi2Se3 Nanoflakes and Enhanced Thermoelectric Properties of Their Nanocomposites," Advanced Materials, Nov. 15, 2012, pp. 1425-1429, vol. 25.
Liu, Yu, "Bottom-up Engineering of Chalcogenide Thermoelectric Nanomaterials," Dissertation at Universitat de Barcelona, Apr. 2018, pp. 1-240.
Schumacher, Christian et al, "Optimizations of Pulsed Plated p and n-type Bi2Te3-Based Ternary Compounds by Annealing in Different Ambient Atmospheres," Advanced Energy Materials, Jun. 7, 2012, pp. 95-104.
Varghese, Tony et al, "High-performance and flexible thermoelectric films by screen printing solution-processed nanoplate crystals," Scientific Reports, Sep. 12, 2016, pp. 1-6, vol. 6: 33135.
Gaul, Andrew, "A Theoretical Study of Enhancing Thermoelectric Efficiency in Pnictogen-Chalcogen Alloys via Doping, Strain, and Nanostructuring," Dissertation at Rensselaer Polytechnic Institute, Mar. 2018, pp. 1-24.
Zhang, Yanliang, "Thermal and thermoelectric transport in nanostructured materials from pnictogen chalcogenide nanoplate crystals," Dissertation at Rensselaer Polytechnic Institute, Nov. 2011, pp. 1-24.
Tangirala, Ravisubhash et al, "Modular inorganic nanocomposites by conversion of nanocrystal superlattices," Angewandte Chemie International Edition, Mar. 18, 2010, pp. 2878-288, vol. 49.
Mehta, Rutvik J. et al, "A new class of doped nanobulk high-figure-of-merit thermoelectrics by scalable bottom-up assembly." Nature materials, as early as Jan. 1, 2012, pp. 1-12.

* cited by examiner

Unsintered

1 Pulse

2 Pulses

5 Pulses

8 Pulses

10 Pulses

1mm

AEROSOL JET PRINTING AND SINTERING OF THERMOELECTRIC DEVICES

CROSS-REFERENCE TO RELATED APPLICATIONS

The present application claims priority to PCT/US2020/036609, filed Jun. 8, 2020, entitled "AEROSOL JET PRINTING AND SINTERING OF THERMOELECTRIC DEVICES", which claims priority to and the benefit of each of U.S. Provisional Patent Application Nos. 62/858,848 filed Jun. 7, 2019 and entitled "HIGH PERFORMANCE THERMOELECTRIC FILMS AND METHOD OF MANUFACTURE"; 62/862,515 filed Jun. 17, 2019 and entitled "AEROSOL JET PRINTING AND PHOTONIC SINTERING OF THERMOELECTRIC FILMS"; and 62/887,845, filed Aug. 16, 2019, and entitled "METHOD OF PRINTING HIGH PERFORMANCE THERMOELECTRIC FILMS". Each of the foregoing is herein incorporated by reference in its entirety.

STATEMENT REGARDING FEDERALLY SPONSORED RESEARCH OR DEVELOPMENT

This invention was made with government support under CMMI1747685 awarded by the National Science Foundation; HR0011-18-2-0030 awarded by DARPA and DE-NE0008712 awarded by the Department of Energy. The government has certain rights in the invention.

BACKGROUND OF THE INVENTION

1. The Field of the Invention

The present invention is in the field of thermoelectric films, e.g., particularly flexible, conformal thermoelectric films that may be printed (e.g., 3D printed) onto a desired substrate, and then sintered. In at least some embodiments such sintering may be achieved at relatively low temperatures, e.g., through photonic sintering.

2. The Relevant Technology

Flexible thermoelectric devices hold great promise for energy harvesting and cooling applications, with increasing significance to serve as perpetual power sources for flexible electronics and wearable devices. Despite unique and superior thermoelectric properties widely reported in nanocrystals, transforming these nanocrystals into flexible and functional forms remains a major challenge.

As such, there exists a continuing need for improved methods of production, compositions (e.g., ink compositions) for use in such production, and resulting thermoelectric (TE) films having excellent TE properties.

BRIEF SUMMARY

The invention relates to conformally printed flexible films, as well as ink compositions for use in forming such flexible films, and methods of fabrication. The method may include applying (e.g., aerosol jet printing) a thermoelectric ink composition to a desired substrate, followed by sintering (e.g., thermal, photonic, or other sintering) of the ink composition to drive off the carrier of the ink composition, as well as to remove a surfactant included therein, converting the thermoelectric nanoparticles of the ink composition into a dense structure capable of charge carrier transport. The surfactant (e.g., a polymer) may aid in preventing or minimizing premature agglomeration of the nanoparticles within the ink composition, prior to sintering.

The ink compositions may include solution-processed chalcogenides (e.g., BiTeSe materials, such as $Bi_2Te_{2.7}Se_{0.3}$ or other chalcogenides, particularly those including Te, such as $Sb_2Te_3$, or a two phase $Sb_2Te_3$—Te composite with excess Te dispersed in a suitable carrier (e.g., polyol(s), alcohol(s), etc.). A surfactant (e.g., polyvinylpyrrolidone ("PVP")) may be present in the ink, which may at least aid in preventing premature agglomeration of the nanoparticles. While PVP is an example of a suitable surfactant capable of preventing premature agglomeration of the nanoparticles, it will be appreciated that various other surfactants (e.g., polymeric or otherwise) may be suitable for use, so long as such material is capable of preventing or minimizing agglomeration of the nanoparticles within the ink composition. The surfactant can be removed during sintering, as when the surfactant is present, the nanoparticles are insulated from one another, rather than being capable of charge carrier transport across a densified structure (which characteristic becomes present after sintering, which removes the surfactant). The surfactant may typically be present in a small amount, e.g., ranging from 0.01% to 5%, from 0.01% to 1%, from 0.05 to 1%, or from 0.1 to 0.5% by weight of the ink composition. Polymers such as PVP may be particularly suitable for use. While various molecular weights may be suitable for use, in an embodiment, the molecular weight may be less than 100,000, such as 1,000 to 80,000, 5,000 to 80,000, or 10,000 to 60,000.

After sintering, the electrical conductivity of the printed film is dramatically increased from non-conductive (i.e., the ink composition is substantially non-conductive) to a value on the order of at least $1 \times 10^4$ S/m. The films demonstrate a room-temperature power factor of at least 100, 200, 300, 400, or at least 500 $\mu Wm^{-1}K^{-2}$. Realized values demonstrated in the Examples section herein ranging from 730 $\mu Wm^{-1}K^{-2}$ to 2200 $\mu Wm^{-1} K^{-2}$ are among the highest values reported for flexible thermoelectric films. The films advantageously show negligible performance changes (e.g., less than 3%, less than 2%, less than 1%, or less than 0.5% increase in electrical resistance) after 500 bending cycles (e.g., at a bending radius of 7 mm or 10 mm). Even at a bending radius of 1.5 mm, the TE film may still show an increase in resistance of only about 10%, after ~500 bending cycles.

While thermal sintering is possible, in at least some embodiments, photonic sintering can be used, involving exposing the applied ink composition on the desired substrate to short pulses of intense light, which can quickly sinter the composition, while also driving off any included carrier, and removing any initially present surfactant. Such a photonic sintering process greatly expands the types of substrates on which the ink composition may be printed, as it does not result in significant heating of the substrate material itself. While it may be possible to use collimated light (e.g., lasers) to perform such sintering, in at least one embodiment, the light used in photonic sintering is relatively diffuse as compared to laser light. Such a process is highly scalable and provides for low-cost fabrication, paving the way for large-scale manufacturing of flexible devices using a variety of high-performing nanoparticle inks.

By way of example, the ink composition may include nanoparticles (e.g., the chalcogenides noted herein) capable of serving as a thermoelectric material once sintered. Examples of such chalcogenide thermoelectric materials include $V_2$—$VI_3$ metal chalcogenides, such as $Bi_2Te_3$, $Bi_x$-

Te$_y$Se$_z$ where x, y, and z represent any value (e.g., Bi$_2$Te$_{2.7}$Se$_{0.3}$), Sb$_2$Te$_3$ and related alloys and compounds. Such materials may be single phase, or may include an excess of a given component, so as to form a two-phase composite type structure. For example, a Sb$_2$Te$_3$—Te composite film may include excess Te. Such an example is described in detail herein. By way of example, an excess component may be present in excess above the stoichiometric ratio in an excess amount of 1% to 25%, 2% to 15%, or 5% to 10%, by weight. In an embodiment, the chalcogenide may be paired with a metal (i.e., metal-chalcogenide). In an embodiment, the chalcogenide may be Se and/or Te (e.g., S may be absent). Any metals included may be semimetals, rather than transition metals, or alkali or alkaline earth metals. For example, particular examples of suitable semimetals for pairing with the chalcogenide may be Sb and/or Bi. It will be apparent that a wide variety of thermoelectric nanoparticles may be suitable for use.

In any case, the nanoparticles may be dispersed within a carrier or solvent (e.g., the term carrier is used herein for simplicity, and includes solvents). The carrier employed for the ink composition may include one or more polyols and an alcohol. It will be appreciated that various carrier materials may be suitable for use, where such may serve to disperse, suspend and/or dissolve the nanoparticles, but which can be removed during sintering. The composition may also advantageously include a surfactant as described herein, for aiding in preventing or minimizing agglomeration of the nanoparticles within the ink composition, until the composition is to be sintered. By way of example, the carrier may include a plurality of polyols, in combination with an alcohol (e.g., a lower alcohol, having 1-4 carbon atoms). For example, in an embodiment, the carrier may include ethylene glycol, and glycerol in combination with the lower alcohol (e.g., ethanol, methanol, propanol, isopropanol, etc.).

The polyols may comprise 20-60% by weight of the carrier, while the alcohol may comprise from 40-80% by weight of the carrier. By way of additional detail, where two polyols are present, the first polyol (e.g., ethylene glycol) may be present in an amount greater than the second polyol (e.g., glycerol). For example, the weight ratio of the first polyol to the second polyol may range from 2:1 to 20:1, or from 2:1 to 10:1, or from 5:1 to 10:1. An exemplary carrier may include a ratio of first polyol (e.g., ethylene glycol): second polyol (e.g., glycerol):alcohol (e.g., ethanol) of 35:5: 60. The carrier may account for the vast majority of the ink composition (e.g., at least 50%, at least 60%, at least 65%, at least 70%, at least 75%, or at least 80% by weight). For example, the other included components in the ink composition may be present in relatively smaller amounts. For example, the nanoparticles themselves may comprise at least 1%, at least 5%, at least 10%, up to 40%, up to 35%, up to 30%, up to 25%, or up to 20% (e.g., 10-20%) by weight of the ink composition, while the surfactant may typically only be included in a very small amount (e.g., less than 1% by weight) of the ink composition.

The ink compositions may exhibit shelf-stability, e.g., allowing the composition to be used for at least 3 months, or at least 6 months after formulation (e.g., without irreversible settling of the nanoparticles, etc.

Various methods can be used for sintering the ink composition once it is printed on the desired substrate. By way of example, photonic sintering as described herein may be used. When photonic sintering the ink composition, the sintering may be completed relatively quickly, such as within less than 30 minutes, less than 20 minutes, less than 10 minutes, less than 5 minutes, less than 1 minute, less than 30 seconds, less than 10 seconds or less than 5 seconds. Such processing times are far faster than typical sintering times, which often take hours.

When photonic sintering, the light may be pulsed. Where the light is pulsed, exposure of the ink composition may be at a pulsed light duration of any value. Exemplary values may be from 1 ms to 10 ms, from 1.5 ms to 5 ms, or from 1.5 ms to 3 ms. Where pulsing of the light is employed during sintering, the pulse delay from the end of one pulse to the beginning of the next may be of any desired value, and may typically range from 100 to 3000 ms, from 200 to 2000 ms, or from 300 to 1000 ms. Overall sintering time may be no more than 10 s, no more than 8 s, no more than 5 s, no more than 3 s, or no more than 2 s.

The power density of the light used for photonic sintering may be sufficient to ensure that not only are the carrier and surfactant materials removed, but that the nanoparticles within the ink composition become densified, capable of charge transport from one nanoparticle to the next adjacent nanoparticle. The nanoparticles may actually become sintered together, such that interfacial boundaries between such particles do not significantly impede charge transport. While various sintering power densities may be used, in an example, the power density may range from 1 kW/cm$^2$ to 10 kW/cm$^2$, from 2 kW/cm$^2$ to 8 kW/cm$^2$, or from 3 kW/cm$^2$ to 6 kW/cm$^2$.

Photonic sintering advantageously allows sintering without requiring significant heating of the underlying substrate material. This greatly increases the variety of materials that can be used for the substrate (e.g., fabric materials, paper or other cellulose-based materials, polymer materials, glass, other ceramic materials, etc., even where such material may have a melting temperature or ignition temperature of less than 400° C.).

In another embodiment, the sintering may be achieved through thermal sintering, e.g., exposing the as printed ink composition on the substrate, to an elevated temperature, for a given period of time, removing the carrier and surfactant from the composition, resulting in a densified configuration to the nanoparticles, capable of charge carrier transport. By way of example, such thermal sintering may be performed at a temperature of at least 200° C., at least 250° C., at least 300° C., or at least 350° C. In an embodiment, the sintering temperature may be no more than 600° C., no more than 550° C., no more than 500° C., no more than 450° C., or no more than 400° C.

When thermal sintering, exposure time at the sintering temperature may be at least 10 minutes, at least 20 minutes, at least 30 minutes, or at least 40 minutes, no more than 6 hours, no more than 5 hours, no more than 4 hours, no more than 3 hours, or no more than 2 hours (e.g., from 30 to 90 minutes may be typical). When thermal sintering, there may be a ramp up time before the above time periods at the sintering temperature are achieved (e.g., some period of time during which the temperature is raised up to the sintering temperature. Similarly, there may be a ramp down time after the above time periods, once the sintering time has been achieved, and the temperature is to be dropped back down to ambient temperature, at a controlled rate. Such ramp up and ramp down periods may have durations similar to the actual sintering time (e.g., from 10 minutes to 6 hours).

No matter the sintering process employed, the present printing techniques allow for application of the ink compositions to curved surfaces (whether rigid or flexible), various surfaces that may be flexible (and which may routinely be flexed in typical use, such as fabrics, clothing, etc.)

The present disclosure is also directed to conformal printed photonic sintered thermoelectric film devices comprising a sintered matrix of thermoelectric nanoparticles (e.g., chalcogenides as described herein) configured as a flexible conformal thermoelectric film, where the thermoelectric film has an electrical conductivity of at least $1\times10^4$ S/m, at least at least $1.5\times10^4$ S/m or at least $2\times10^4$ S/m. Alternatively or additionally, the thermoelectric film may have a power factor of at least 500 $\mu$W/mK$^2$, at least 600 $\mu$W/mK$^2$, at least 700 $\mu$W/mK$^2$, at least 1000 $\mu$W/mK$^2$, at least 1500 $\mu$W/mK$^2$, or at least at least 2000 $\mu$W/mK$^2$.

Such power factor values may be achieved over a relatively wide operating temperature range, e.g., from 300 to 550 K, or from 350 to 500 K. It is advantageous that such power factor values be achievable within temperature ranges where waste heat is typically available (e.g., within 300 K, within 200 K, or within 100 K of ambient temperature (e.g., 20-25° C.)).

Such power factor values may be achieved or associated with temperature differentials (ΔT) of less than 100 K, such as from 10 K to 100 K, 10 K to 80 K, 20 K to 60 K or the like.

The thermoelectric material may be an n-type, or a p-type thermoelectric material. Doping to achieve such may be with any suitable dopant. Dopant levels may be at any value, such as from $1\times10^{19}$ cm$^{-3}$ to $1\times10^{20}$ cm$^{-3}$.

The film may have any applied thickness, or other feature size, for example, from 10 $\mu$m to 1000 $\mu$m.

The film may be applied to any of a wide variety of substrates, as described herein. In particular, the film, and/or the substrate may be flexible, e.g., exhibiting little or no change in electrical conductivity (or resistivity) or power factor after 500 bending cycles (at a bending radius from 1 to 10 mm). Similarly, the film may exhibit no significant delamination and/or cracking as a result of such bending.

The films or membranes can be directly 3D printed onto any of a wide variety of surfaces. Since they can be 3D printed, they can be printed in any desired pattern, the options of which are unlimited. The ability to fabricate films on flexible and low temperature substrates is a key advantage. In addition, the ability to directly print the devices onto virtually any 3D conformal surface and integrate the TE device with the end use system or product is advantageous, providing greatly increased manufacturing flexibility as compared to existing methods. Thus, while at least some of the examples described herein may be directed to printing onto a given film for purposes of illustrating the capability, the present printing methods can directly convert the nanoparticles into complete thermoelectric devices with any desired sophisticated design pattern, which advantages are not provided by existing alternatives.

Further features and advantages of the present invention will become apparent to those of ordinary skill in the art in view of the detailed description of preferred embodiments below.

BRIEF DESCRIPTION OF THE DRAWINGS

To further clarify the above and other advantages and features of the present invention, a more particular description of the invention will be rendered by reference to specific embodiments thereof which are illustrated in the drawings located in the specification. It is appreciated that these drawings depict only typical embodiments of the invention and are therefore not to be considered limiting of its scope.

The invention will be described and explained with additional specificity and detail through the use of the accompanying drawings.

(FIGS. 8C-8D: 4.23 kW/cm$^2$ and 2.5 ms); and (FIGS. 8E-8F: 5.1 kW/cm$^2$ and 1.5 ms). The delay time between two adjacent pulses was 1000 ms.

FIG. 12B showing device operating voltage vs. current, shown for various $\Delta T$ values; FIG. 12C showing power output vs. electrical current, shown for various $\Delta T$ values; and FIG. 12D showing electrical power density versus $\Delta T$.

FIG. 22A shows Seebeck coefficient as a function of carrier concentration at 300, 400 and 500 K. FIG. 22B shows Seebeck coefficient as a function of temperature for two fixed doping levels. FIG. 22C shows electronic fitness function (EFF). FIG. 22D shows a carrier pocket visualization, showing isosurfaces 0.1 eV below the valence band maximum. In FIG. 22D, transport data shown are direction averages.

FIG. 23A shows experimental open circuit voltage (Voc) vs. temperature differences ($\Delta T$). FIG. 23B shows operating device voltage vs. current at various $\Delta T$ values. FIG. 23C shows power output vs. electrical current at various $\Delta T$ values. FIG. 23D shows experimental power density at various $\Delta T$ values.

DETAILED DESCRIPTION OF THE PREFERRED EMBODIMENTS

I. Definitions

Figure 1A:
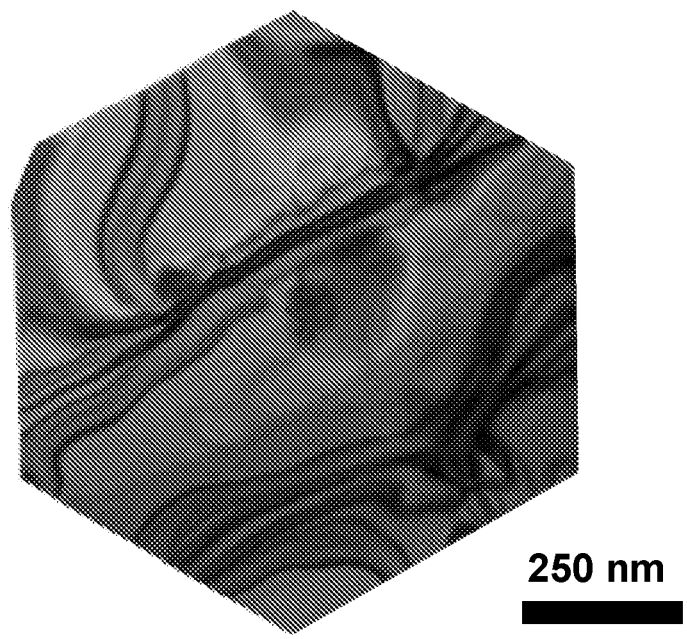
FIG. 1A shows a TEM image of $Bi_2Te_{2.7}Se_{0.3}$ nanoplates.

Before describing the present invention in detail, it is to be understood that this invention is not limited to particularly exemplified systems or process parameters that may, of course, vary. It is also to be understood that the terminology used herein is for the purpose of describing particular embodiments of the invention only and is not intended to limit the scope of the invention in any manner.

All publications, patents and patent applications cited herein, whether supra or infra, are hereby incorporated by reference in their entirety to the same extent as if each individual publication, patent or patent application was specifically and individually indicated to be incorporated by reference.

The term "comprising," which is synonymous with "including," "containing," or "characterized by," is inclusive or open-ended and does not exclude additional, unrecited elements or method steps.

The term "consisting essentially of" limits the scope of a claim to the specified materials or steps "and those that do not materially affect the basic and novel characteristic(s)" of the claimed invention.

The term "consisting of" as used herein, excludes any element, step, or ingredient not specified in the claim.

It must be noted that, as used in this specification and the appended claims, the singular forms "a," "an" and "the" include plural referents unless the content clearly dictates otherwise.

Numbers, percentages, ratios, or other values stated herein may include that value, and also other values that are about or approximately the stated value, as would be appreciated by one of ordinary skill in the art. As such, all values herein are understood to be modified by the term "about". A stated value should therefore be interpreted broadly enough to encompass values that are at least close enough to the stated value to perform a desired function or achieve a desired result, and/or values that round to the stated value. The stated values include at least the variation to be expected in a typical manufacturing process, and may include values that are within 10%, within 5%, within 1%, etc. of a stated value. Furthermore, where used, the terms "substantially", "similarly", "about" or "approximately" represent an amount or state close to the stated amount or state that still performs a desired function or achieves a desired result. For example, the term "substantially" "about" or "approximately" may refer to an amount that s within 10% of, within 5% of, or within 1% of, a stated amount or value.

Some ranges may be disclosed herein. Additional ranges may be defined between any values disclosed herein as being exemplary of a particular parameter. All such ranges are contemplated and within the scope of the present disclosure.

Unless otherwise stated, all percentages described herein are by weight.

In some embodiments, the films and compositions described herein may be free or substantially free from any specific components not mentioned within this specification. By 'substantially free of' it is meant that the composition or article preferably comprises 0% of the stated component, although it will be appreciated that very small concentrations may possibly be present, e.g., through incidental formation, contamination, or even by intentional addition. Such components may be present, if at all, in amounts of less than 1%, less than 0.5%, less than 0.25%, less than 0.1%, less than 0.05%, less than 0.01%, less than 0.005%, less than 0.001%, or less than 0.0001%.

Unless defined otherwise, all technical and scientific terms used herein have the same meaning as commonly understood by one of ordinary skill in the art to which the invention pertains. Although a number of methods and materials similar or equivalent to those described herein can be used in the practice of the present invention, the preferred materials and methods are described herein.

II. Introduction

The present invention is directed to 3D conformal printed flexible films, as well as methods and ink compositions useful for preparing such. The method may include aerosol jet printing a thermoelectric ink composition, followed by photonic or other sintering of the ink composition to drive off carrier or solvent included therein, and to remove any included surfactant. Such sintering converts the thermoelectric nanoparticles of the ink composition into a dense structure capable of charge carrier transport. The ink compositions may be solution-processed chalcogenides (e.g., Te containing materials, such as $Bi_xTe_ySe_z$ ($Bi_2Te_{2.7}Se_{0.3}$), $Sb_2Te_3$, or a $Sb_2Te_3$—Te composite) suspended or otherwise provided in a suitable carrier or solvent (e.g., polyol(s), alcohol(s), etc.). As already noted, the term "carrier" is used for simplicity, and it will be appreciated that for some systems, the carrier could actually be a solvent, such that "carrier" is to be construed broadly. A surfactant (e.g., a polymer surfactant such as PVP) may also be present in the ink. Non-limiting examples of other possible surfactants include cetrimonium bromide (CTAB) and ethylenediaminetetraacetic acid (EDTA) salts, e.g., ETDA disodium salt, as well as combinations of more than one surfactant. The chalcogenide(s) present may be in the form of nanoparticles (e.g., nanoplates, nanorods, or the like), e.g., which may be dispersed, suspended, or otherwise provided within the ink composition. The present ink compositions are stable, allowing storage of the composition, which can be used anytime within a period of months (e.g., up to 3 months, or up to 6 months) after formulation, for printing using such methods as described herein.

Once sintered, (which occurs within a matter of seconds in the case of photonic sintering), the electrical conductivity of the printed film is dramatically increased from non-conductive (for the ink composition) to a value on the order of at least $1\times10^4$ S/m (e.g., in the range of $1\times10^4$ S/m to $1\times10^6$ S/m, or $1\times10^4$ S/m to $1\times10^5$ S/m, characteristic of semiconductors). Films printed and sintered as described herein exhibit room-temperature power factors of at least 100, 200, 300, 400, or at least 500 $\mu Wm^{-1}K^{-2}$. The realized values of 730 to 2200 $\mu Wm^{-1}K^{-2}$ achieved in the Examples herein are among the highest values reported for flexible thermoelectric films. The films show negligible performance changes (e.g., less than 3%, less than 2%, less than 1%, or less than 0.5% increase in electrical resistance) after 500 bending cycles (e.g., at a bending radius of 10 mm, 7 mm, or the like). Even upon such repeated bending about a tight 1.5 mm radius, electrical resistance only increased ~10%. The highly scalable and low-cost fabrication process paves the way for large-scale manufacturing of flexible devices using a variety of high-performing semiconductor nanoparticle inks.

III. Exemplary Methods, Compositions, and Devices

Solution-printable and shape-conformable thermoelectric (TE) devices have attracted considerable attentions due to their broad applications in cooling and energy harvesting for powering flexible electronics and sensors. Compared with early strategies like vacuum filtration and spin/spray coating that have been used in attempts to fabricate flexible TE films, ink based printing methods have not been widely explored, and have the potential to directly transform TE particles into a completed device pattern without the need for other complex fabrication processes. However, it has been a major challenge to achieve outstanding TE properties and mechanical flexibility in printed films due to the typically reduced density of printed films and the restricted sintering temperature when printing on flexible substrates with low melting points. Sintering is an important step in colloidal nanoparticle-based printing in order to remove any surfactant that may be present and to transform the nanoparticles into a dense structure capable of charge carrier transport. However, most of the better performing TE materials reported within the field require high sintering temperatures above 400° C. for several hours, severely limiting substrate choices.

According to at least some embodiments of the present invention, sintering is accomplished using photonic sintering, which does not significantly raise the temperature of the substrate, greatly expanding the choice of materials that can be used for the substrate. Another alternative sintering method disclosed herein uses thermal sintering. In at least some thermal sintering embodiments, the sintering temperature may still be no more than 400° C., which shows excellent results as detailed in the Examples below, with various substrate materials (e.g., a polyimide polymer).

In contrast to thermal sintering methods, rapid and versatile photonic sintering using intense pulsed light (IPL) offers great advantages as it can sinter the printed films at elevated temperatures without overheating or damaging the underlying substrate by confining energy delivery to the printed films (e.g., minimizing heating in the substrate). IPL may refer to use of light for sintering, where the light provides a power density of at least 500 kW/cm², or at least 1 kW/cm². In an embodiment, IPL may exclude collimated laser light. According to an embodiment, the present disclosure provides flexible TE films fabricated using an innovative and versatile 3D conformal aerosol jet printing method, which can directly print TE devices with microscale spatial resolution with sub-micron thickness control on both 2D planar and 3D curved or other shaped substrates using colloidal nanoparticle ink compositions with a wide range of viscosities. Such membranes can be directly 3D printed onto any of a wide variety of surfaces. Furthermore, since they can be 3D printed (e.g., additive printing, in additive layers, if desired), they can be printed as any desired pattern, the options of which are unlimited. The ability to fabricate films on flexible and low temperature substrates is a key advantage. In addition, the ability to directly print the devices onto virtually any 3D conformal surface and integrate the TE device with the end use system or product is advantageous, providing greatly increased manufacturing flexibility as compared to existing methods. Thus, while at least some of the examples described herein may be directed to printing onto a given film for purposes of illustrating the capability, the present printing methods can directly convert the nanoparticles into complete thermoelectric devices with any desired sophisticated design pattern, which advantages are not provided by existing alternatives. A greater range of viscosity in the ink composition is tolerated when aerosol jet printing (e.g., 1 to 1000 cps), as compared to ink jet printing, where viscosity characteristics must be carefully controlled (e.g., 5 to 15 cps).

Combined with photonic sintering or thermal sintering, the present disclosure achieves flexible films and devices fabricated from solution-processed chalcogenides (e.g., Te-chalcogenide based nanoparticles) on a variety of substrates. The sintering dramatically improves the electrical conductivity of the printed films from non-conductive (of the ink as printed) to values from $1 \times 10^4$ S/m to $1 \times 10^6$ S/m (e.g., $2.7 \times 10^4$ S/m in an example) within seconds, which lead to a very high power factor, e.g., of at least 500 $\mu Wm^{-1}K^{-2}$, such as 500 to 3000 $\mu Wm^{-1}K^{-2}$ (e.g., 730 $\mu Wm^{-1}K^{-2}$, 1500 $\mu Wm^{-1}K^{-2}$, or 2200 $\mu Wm^{-1}K^{-2}$ in various examples) at room temperature. The 3D conformal aerosol jet printing and photonic sintering or thermal sintering opens the opportunity to directly integrate high-efficiency nanoparticles into a broad range of complex systems where TE devices could be useful for cooling and energy harvesting applications.

Figure 1B:
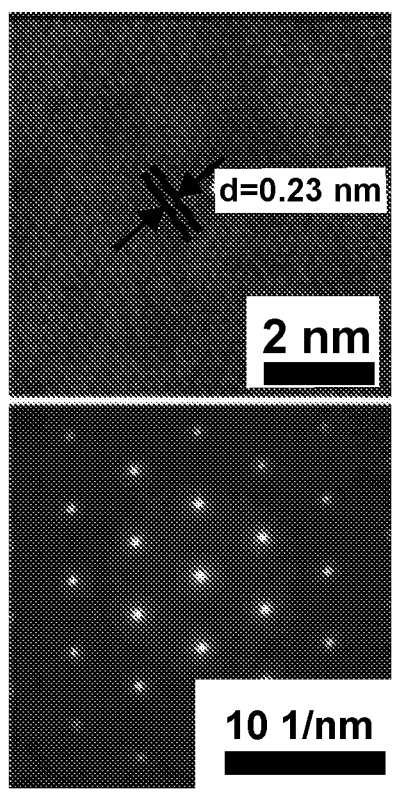
FIG. 1B shows an HRTEM image of the $Bi_2Te_{2.7}Se_{0.3}$ nanoplates of FIG. 1A.
Figure 2A:
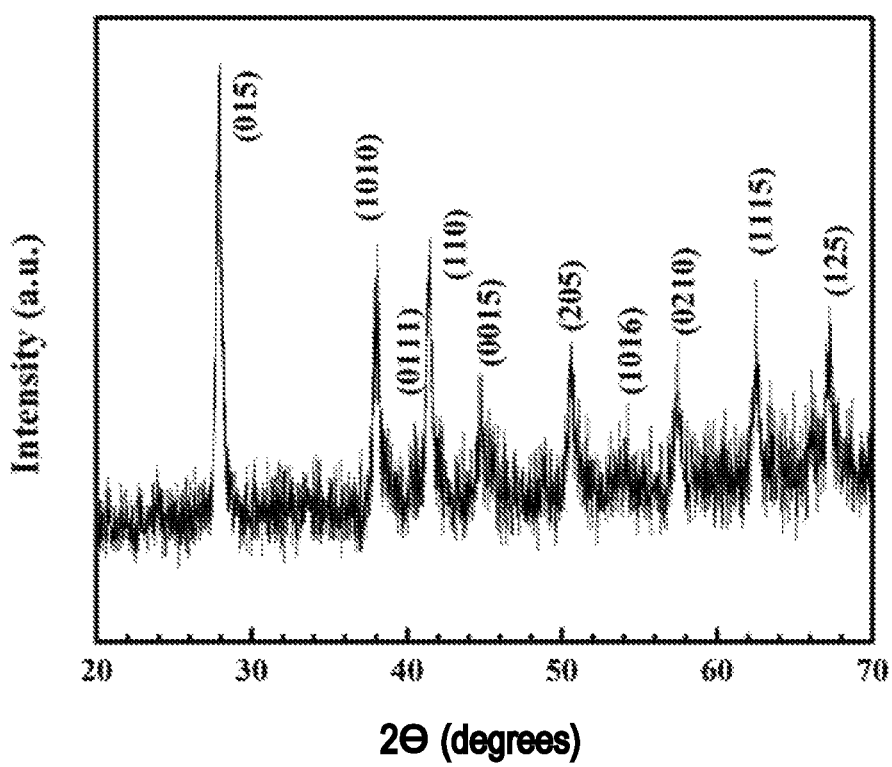
FIG. 2A shows an XRD characterization of as-fabricated $Bi_2Te_{2.7}Se_{0.3}$ nanoparticles based on a reflux-synthesis method.
Figure 2B:
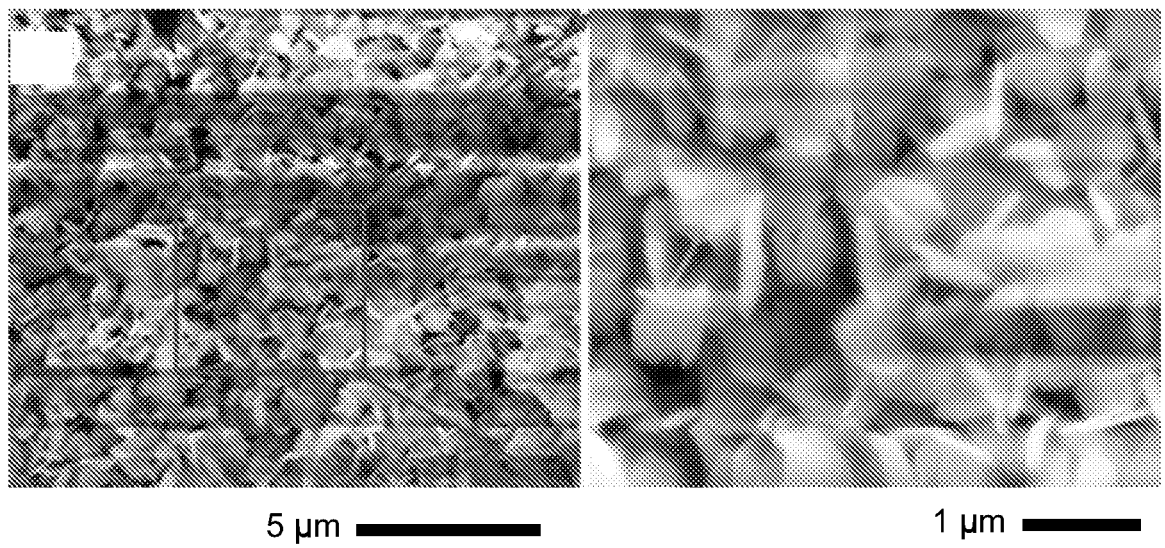
FIG. 2B shows SEM images of the as-fabricated $Bi_2Te_{2.7}Se_{0.3}$ nanoparticles from FIG. 2A.
Figure 3:
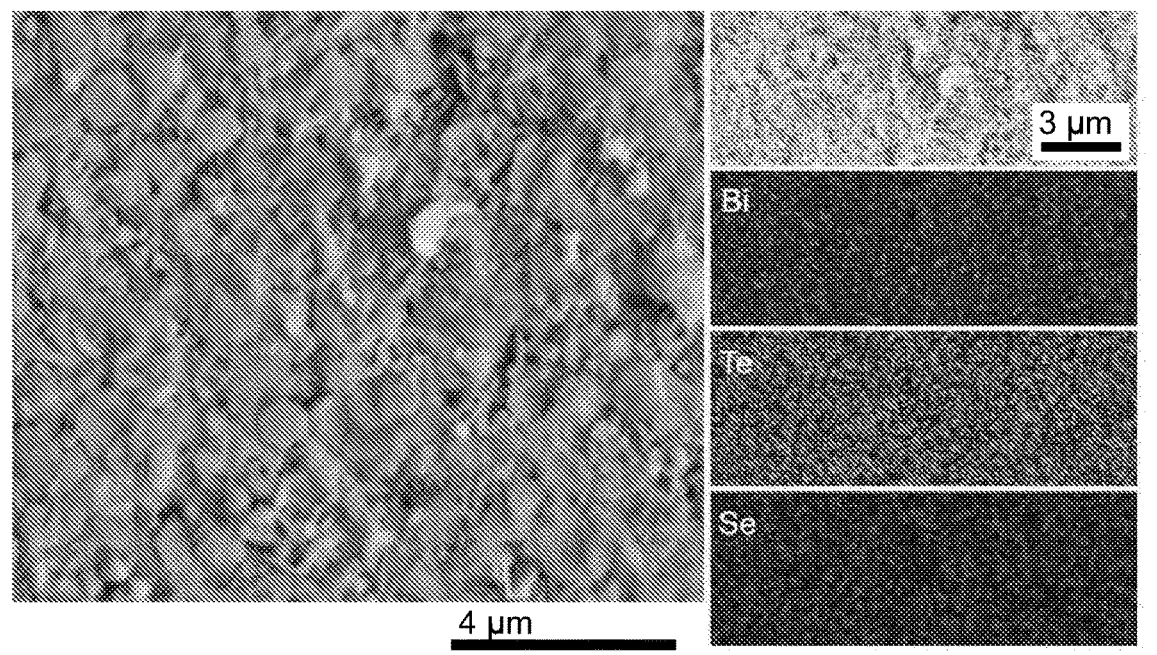
FIG. 3 shows SEM and energy dispersive X-ray (EDX) mapping images of the printed $Bi_2Te_{2.7}Se_{0.3}$ film after photonic sintering, showing substantially uniform distribution of Bi, Te and Se with reserved elemental ratio during the sintering process.
Figure 3:
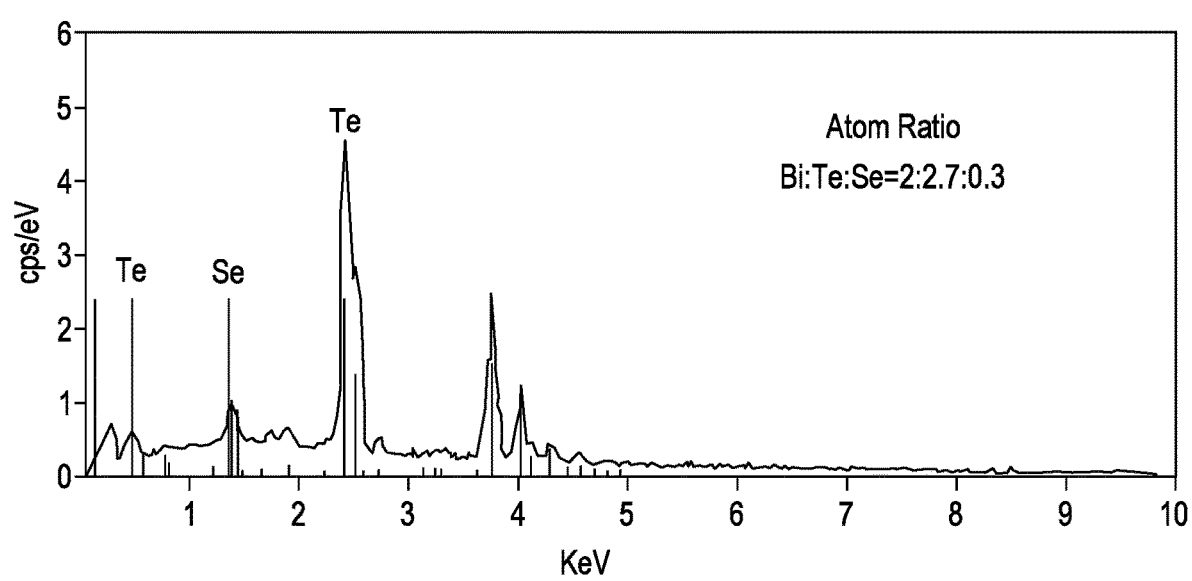
Figure 4A:
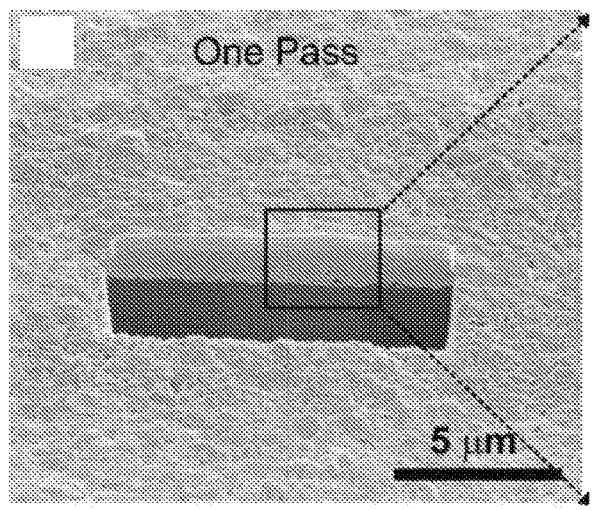
FIGS. 4A-4D show SEM images of the photonic sintered $Bi_2Te_{2.7}Se_{0.3}$ films after one pass (FIGS. 4A-4B) and two passes (FIGS. 4C and 4D).
Figure 4B:
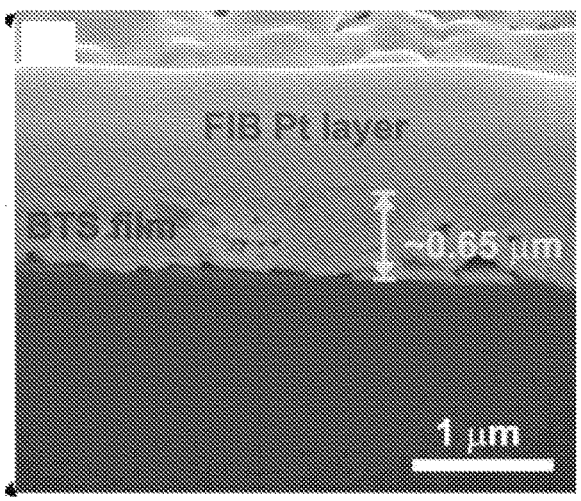
Figures 4C, 4D:
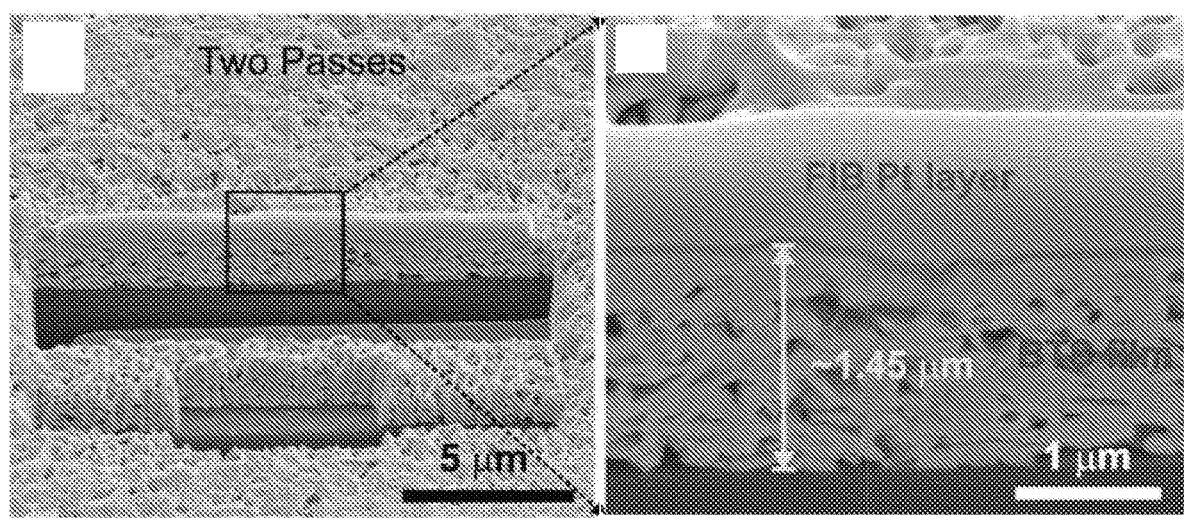

To demonstrate the aerosol jet printing and photonic sintering, n-type $Bi_2Te_{2.7}Se_{0.3}$ nanoplates were synthesized using a bottom-up wet-chemical method and converted into printable ink. X-ray diffraction (XRD) measurement was conducted, as can be seen in FIGS. 2A-2B, with all XRD spectra indexed with rhombohedral symmetry with space group R3m. Here, no detectable peaks of any impurities were observed. The as-fabricated $Bi_2Te_{2.7}Se_{0.3}$ nanocrystals were also investigated by high-resolution transmission electron microscopy (HRTEM), as shown in FIGS. 1A-1B, indicating high crystalline quality.

Figure 1C:
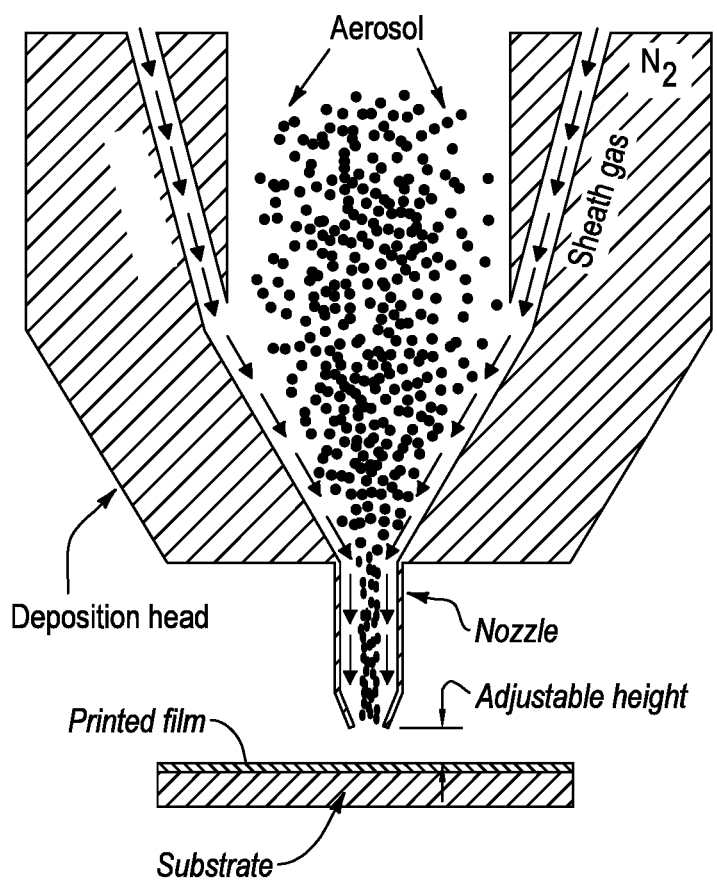
FIG. 1C shows a schematic illustration of an exemplary aerosol jet 3D printer conformal deposition head.
Figure 1D:
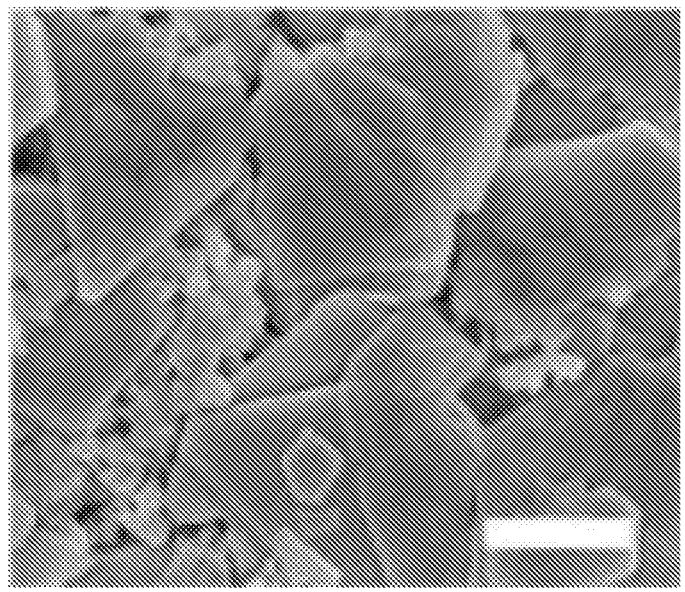
FIG. 1D shows an SEM image of the printed film before sintering, with the scale bar being 500 nm.
Figure 1E:
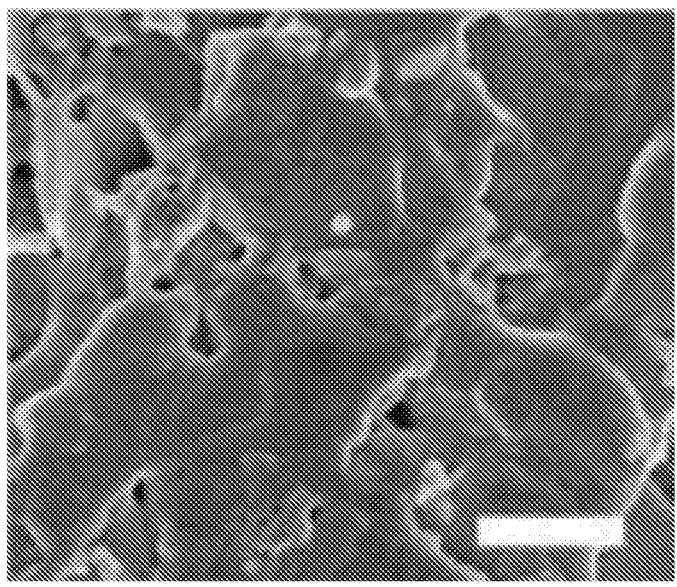
FIG. 1E shows an SEM image of the printed film of FIG. 1D, after sintering, with the scale bar being 500 nm.
Figure 1F:
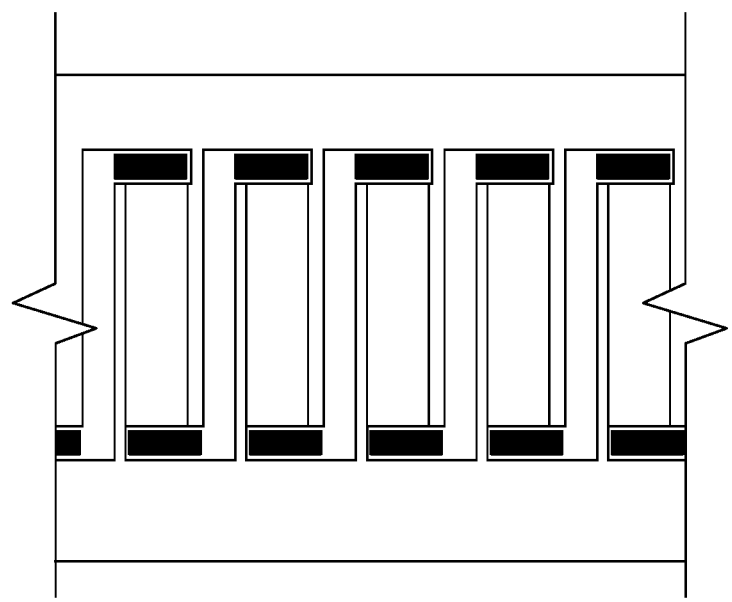
FIG. 1F shows an exemplary 3D conformally printed thermoelectric structure, including thermoelectric material printed on a substrate (e.g., polymer, such as polyimide), with adjacent thermoelectric stripes connected to one another by Ag ink printed legs.

Scanning electron microscopy (SEM) shown in FIG. 2A demonstrates the uniform size distribution of the nanoplates. The as-fabricated $Bi_2Te_{2.7}Se_{0.3}$ nanoplates were dispersed in a mixed carrier (or solvent) of ethylene glycol, glycerol and ethanol with ratios specifically selected to produce a printable ink with desired viscosity (e.g., 1 to 1000, such as 5 to 500, or 5 to 15 cps). Additional details are provided in the examples section. Using the colloidal nanocrystal ink, TE films with virtually any desired pattern can be fabricated by the present aerosol jet printing methods onto any of various suitable substrates, such as a 2D flexible substrate (e.g., paper, polymer such as polyimide, or other) or a 3D curved or other shaped substrate (e.g., a glass tube), whether flexible or rigid. FIG. 1C schematically illustrates an exemplary aerosol jet printing method, which is more versatile than an ink jet method, allowing use of a wider range of viscosity ink compositions, as well as other benefits.

The thickness of the printed film can be precisely controlled by regulating the ink mass flowrate and number of printing passes. For example, in an embodiment, any desired thickness in a range from 10 to 1000 $\mu m$ can easily be achieved. Finally, either photonic sintering or thermal sintering can be employed to achieve the densification and grain growth of the aerosol-printed nanoparticles. Photonic sintering in particular provides an ultrafast pathway to improve the carrier mobility and thermoelectric performance.

To systematically investigate the processing-structure-property correlations of intense pulsed light (IPL) sintering, different values for the pulsed light power density, pulse duration and number of pulses were tested, and the resulting microstructures and TE properties were evaluated. For photonic sintering with a single pulse, the IPL power density was adjusted in order to achieve suitable electrical conductivity σ. In the present examples, all samples were printed with one pass on Kapton (a polyimide). Initially, unsintered $Bi_2Te_{2.7}Se_{0.3}$ printed films have high (e.g., infinite) resistivity as a result of the non-conductive surfactant (e.g., polyvinylpyrrolidone ("PVP")) included in the ink composition. The print process parameters were as shown below, in Table 1. Of course, various other values may also be suitable for use (e.g., ±50% from those shown).

TABLE 1

| Parameter | Value |
| --- | --- |
| Nozzle Diameter (μm) | 150 |
| PA Atomizer Flow (sccm) | 550 |
| Exhaust Flow (sccm) | 500 |
| Sheath Gas Flow (sccm) | 12 |
| Platen Temperature (° C.) | 70-75 |
| Process Speed (mm/s) | 5-5.5 |

Figure 7A:
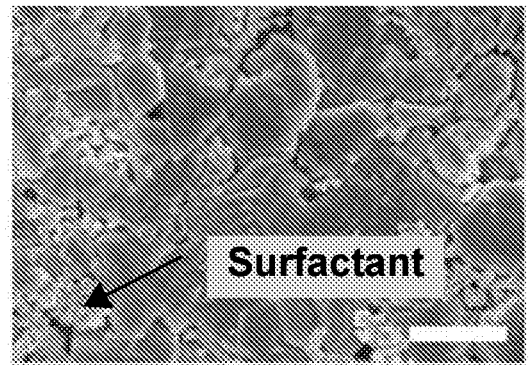
FIGS. 7A-7F show SEM images of an unsintered sample (FIG. 7A), as well as after sintering with from 1 to 10 pulses (FIGS. 7B-7F), at a power density of 5.1 kW/cm$^2$, with a 1.5 ms pulse duration, and 362 ms delay between pulses. The scale bar is 1 $\mu$m.
Figure 7B:
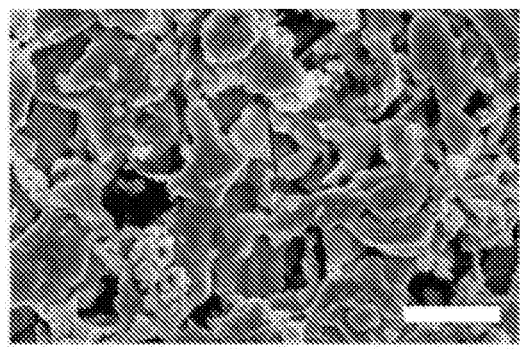
Figure 7C:
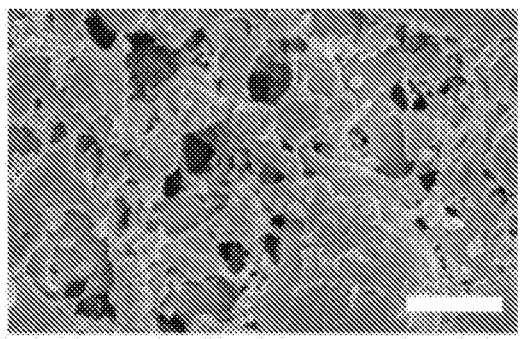
Figure 7D:
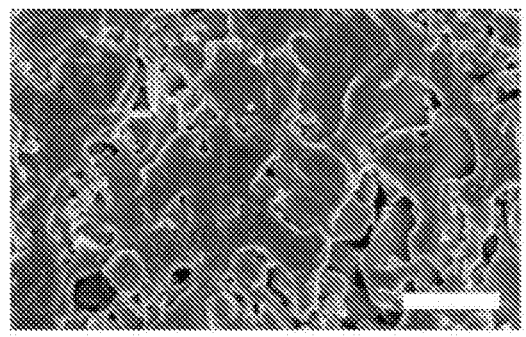

Upon photonic sintering (5 pulses, as shown in FIG. 7D), the insulating PVP is at least partially removed (e.g., typically substantially fully removed), as verified by CHN analysis, shown below in Table 2. The result after sintering is a 3D network composed of $Bi_2Te_{2.7}Se_{0.3}$ nanoplates.

TABLE 2

| Sample | Carbon (wt %) | Nitrogen (wt %) |
| --- | --- | --- |
| Unsintered $Bi_2Te_{2.7}Se_{0.3}$ | 2.7 | 0.07 |
| Sintered $Bi_2Te_{2.7}Se_{0.3}$ | 0.38 | 0.03 |

Figure 5A:
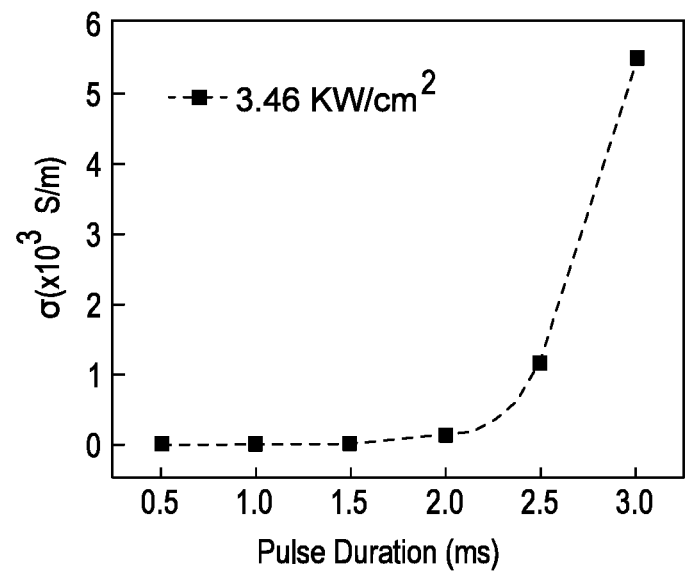
FIGS. 5A-5C show electrical conductivity ($\sigma$) of the sintered samples (on Kapton polyimide) by single pulse under power densities of 3.46, 4.23 and 5.1 kW/cm$^2$, respectively, for pulse duration times from 0.5 to 3 ms.
Figure 5B:
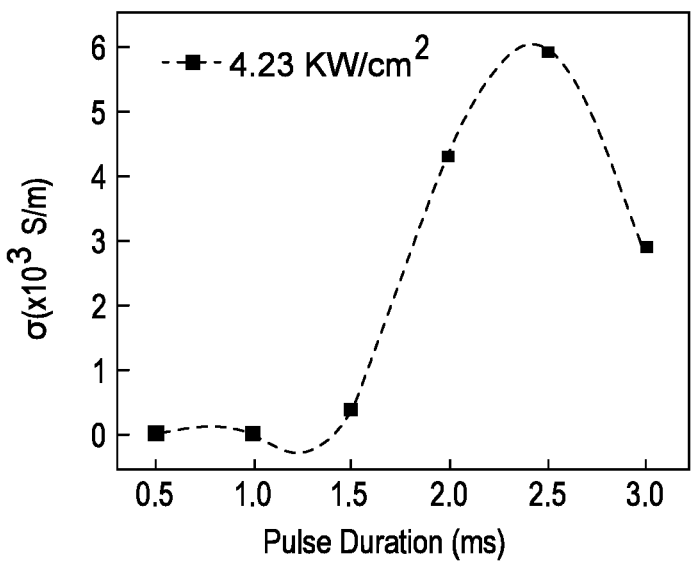
Figure 5C:
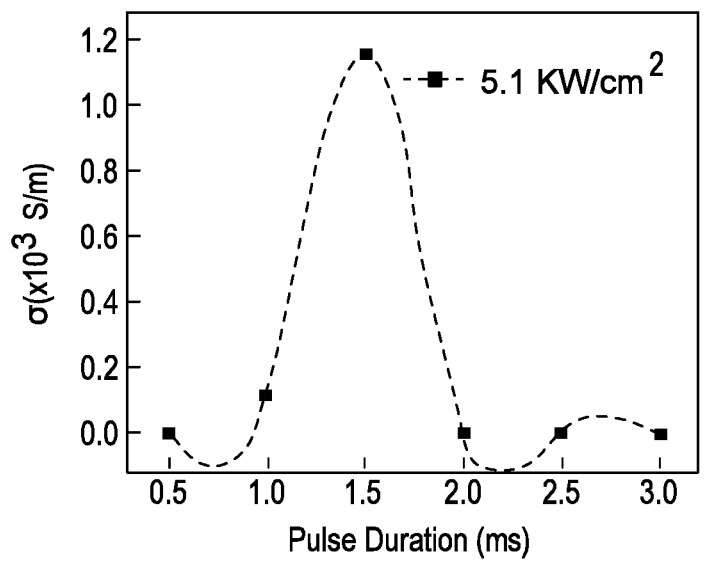
Figure 6A:
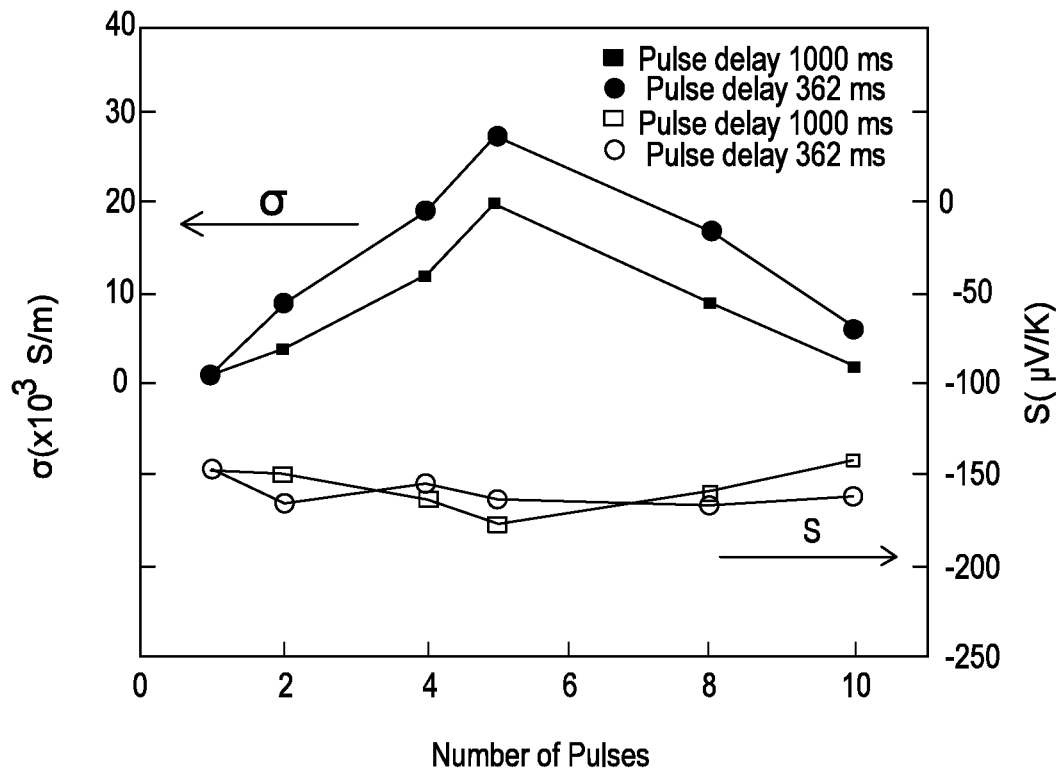
FIGS. 6A-6B show electrical conductivity $\sigma$ (FIG. 6A), Seebeck coefficient S (FIG. 6A), and power factor PF (FIG. 6B) as a function of number of pulses under a power density of 5.1 kW/cm$^2$, at a pulse duration of 1.5 ms and at two different pulse delay times (between pulses) of 1000 ms and 362 ms.
Figure 6B:
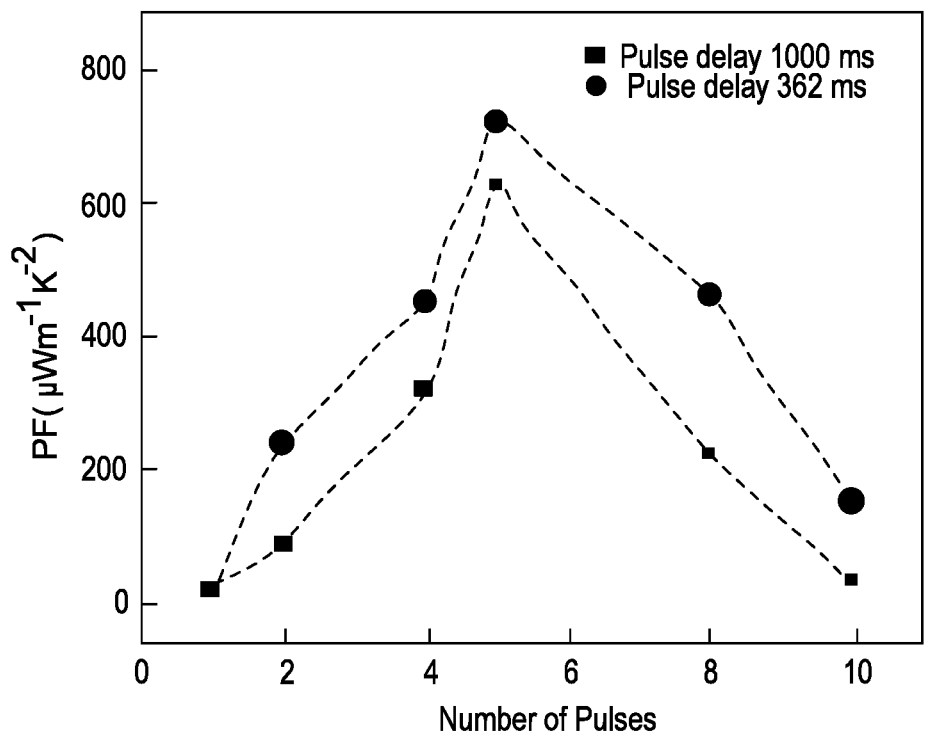

After sintering, the electrical conductivity of all samples is increased by orders of magnitude. As can be seen in FIGS. 5A-5C, the electrical conductivity σ increases with increasing pulse duration until it reaches a maximum value and then decreases with further exposure. The maximum σ was achieved in the tested samples with pulse durations of 3, 2.5 and 1.5 milliseconds (ms) under power densities of 3.46, 4.23 and 5.1 $kW/cm^2$ respectively. For a power density of 3.46 $kW/cm^2$, the further increased σ may be achieved with longer pulse duration, as this was the maximum selectable value for the photonic sintering machine used in the particularly performed testing.

In order to further improve the TE properties, the number of pulses can be adjusted. For example, three sets of varied pulse duration values and power density values as identified above for single pulse sintering were tested. The electrical conductivity σ, Seebeck coefficient S, and power factor PF, where $PF=\sigma \cdot S^2$, with different number of pulses were measured, as shown in FIGS. 8A-8F. Here, 1000 ms delay time was imposed between adjacent pulses. In general, a significant increase in σ is observed with multiple pulses, as compared to single pulse sintering. The σ peaks at an ideal number of pulses before it drops drastically. The Seebeck coefficient S is relatively insensitive to pulse number, indicating the composition and charge carrier concentration of the films remain relatively unchanged during the sintering process. Therefore, the power factor (PF) follows a similar trend as the σ, showing a maximum value at an optimum number of pulses that yields the maximum σ. It is notable that the electrical conductivity and power factor reach $2 \times 10^4$ S/m and 630 $\mu Wm^{-1}K^{-2}$ within a few seconds of photonic sintering, as shown in FIGS. 2A-2B.

The performance of the present n-type $Bi_2Te_{2.7}Se_{0.3}$ films can be further improved by further adjusting the pulse delay time during the multiple pulse sintering process. The pulse delay time was reduced from 1000 ms to 362 ms, which was the shortest pulse delay time allowed by the particular sintering machine employed in the tests. As shown in FIG. 2A, the maximum electrical conductivity of $2.7 \times 10^4$ S/m was achieved with this reduced pulse delay time, representing a 35% enhancement over the electrical conductivity of films sintered with a 1000 ms pulse delay time. Despite a slight decrease in Seebeck coefficient, the final PF shows a 16% enhancement with the total sintering time reduced from 4 seconds to less than 1.5 seconds. In short, the maximum PF of aerosol jet printed n-type $Bi_2Te_{2.7}Se_{0.3}$ films under photonic sintering conditions as described reaches 730 $\mu Wm^{-1}K^{-2}$ at room temperature, which is among the highest demonstrated values for flexible n-type TE materials. Table 3 summarizes the comparison of TE performance of various flexible n-type TE materials, demonstrating the promise of aerosol jet printing followed by sintering, for providing high performance, low cost flexible TE devices, e.g., whether such printing is combined with photonic sintering, or thermal sintering. Examples using thermal sintering are described in greater detail hereafter.

TABLE 3

| Material | PF ($\mu Wm^{-1}K^{-2}$) | Sintering Time (s) | Method |
| --- | --- | --- | --- |
| The Present $Bi_2Te_{2.7}Se_{0.3}$ | 730 | <1.5 | Aerosol Jet Printing |
| $Bi_2Te_{2.8}Se_{0.2}$ | 560 | 2700 | Screen Printing |
| $Bi_2Te_3$ + Epoxy | 280 | 43200 | Dispenser Printing |
| $Cu_{0.01}Bi_2Se_{2.8}$ + PDVF | 103 | 18000 | Drop Coating |
| $Bi_2Te_3$ | 163 | 7200 | Ink Jet Printing |
| $C_{60}/TiS_2$ | 400 | 3600 | Vacuum Filtering |
| $TiS_2/(hexyl-ammonium)_x(H_2O)y(DMSO)_z$ | 450 | >3600 | Electrochemical Intercalation |
| $WS_2$ | 5-7 | 3600 | Vacuum Filtration |
| Carbon Nanotube | 150 | N.A. | Drop Casting |

Figure 7E:
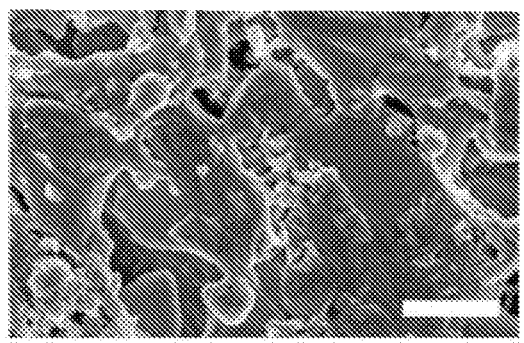
Figure 7F:
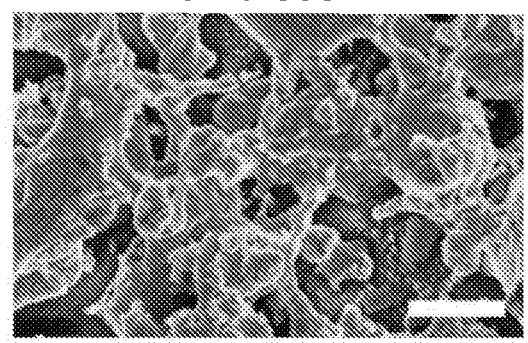
Figure 7G:
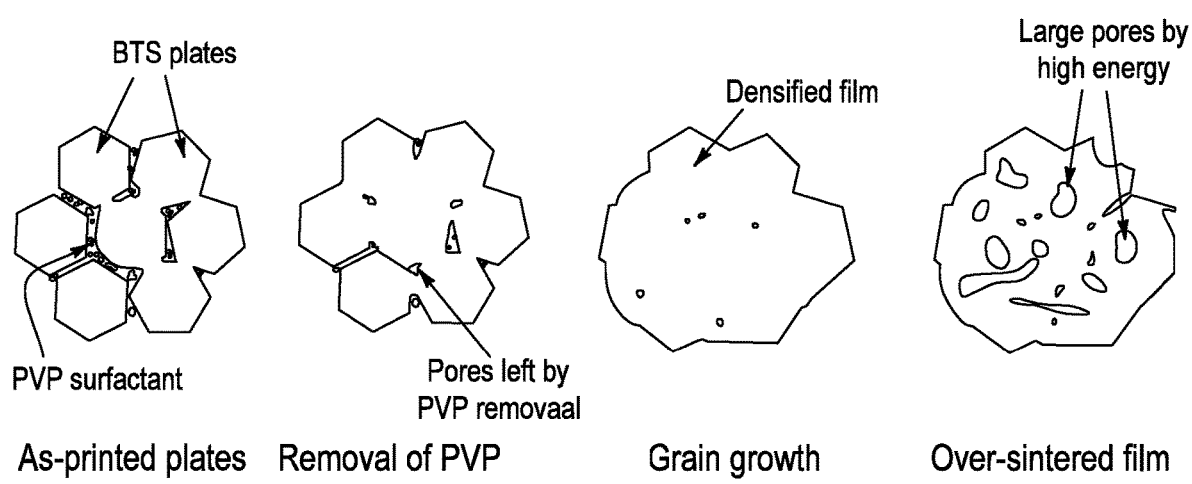
FIG. 7G schematically illustrates evolution of the microstructure upon pulse sintering.
Figure 8A:
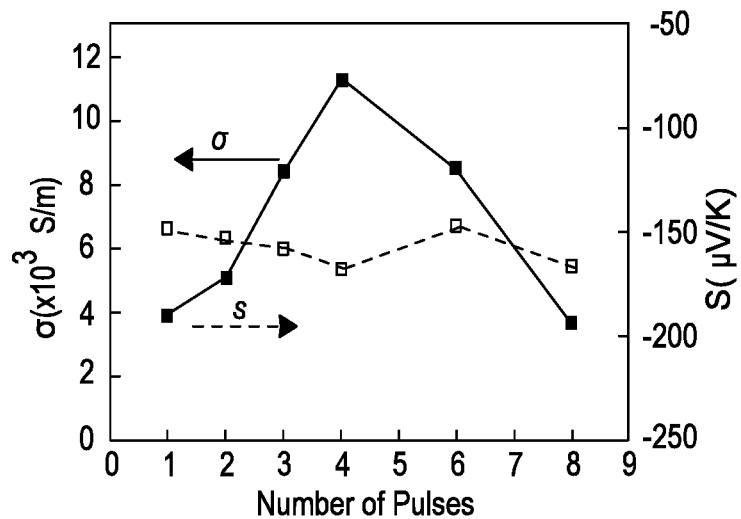
FIGS. 8A-8F show electrical conductivity $\sigma$, Seebeck coefficient S, and power factor PF vs. number of pulses of the samples sintered for three sets of power densities and pulse durations (FIGS. 8A-8B: 3.46 kW/cm$^2$ and 3 ms)
Figure 8B:
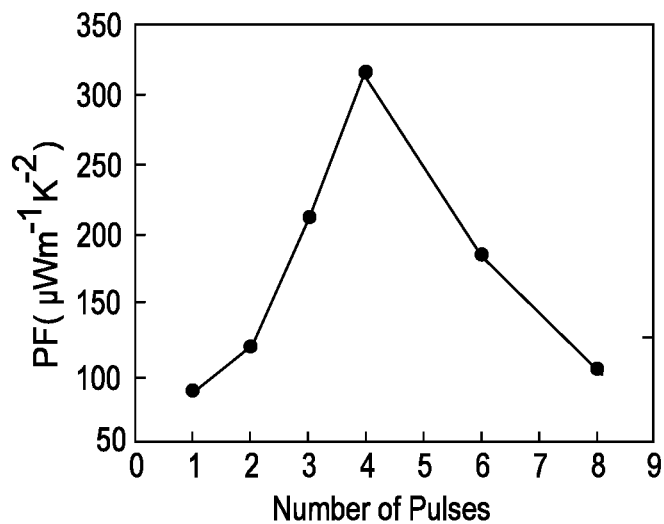
Figure 8C:
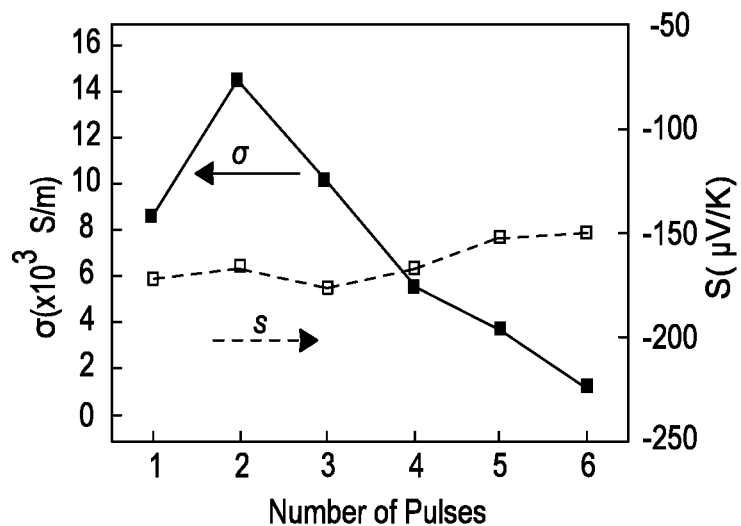
Figure 8D:
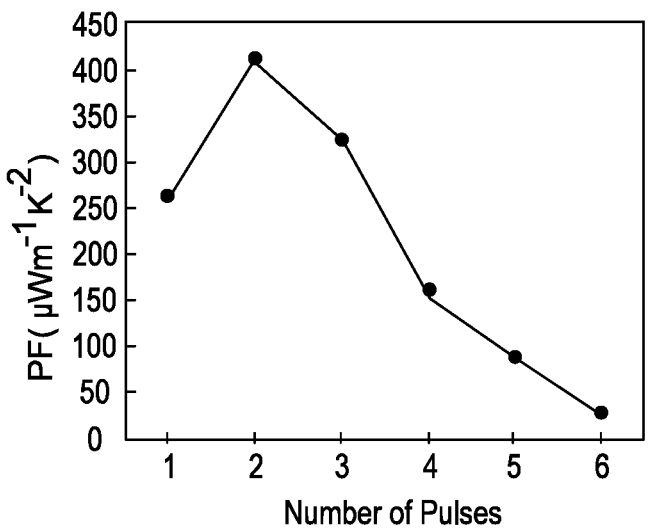
Figure 8E:
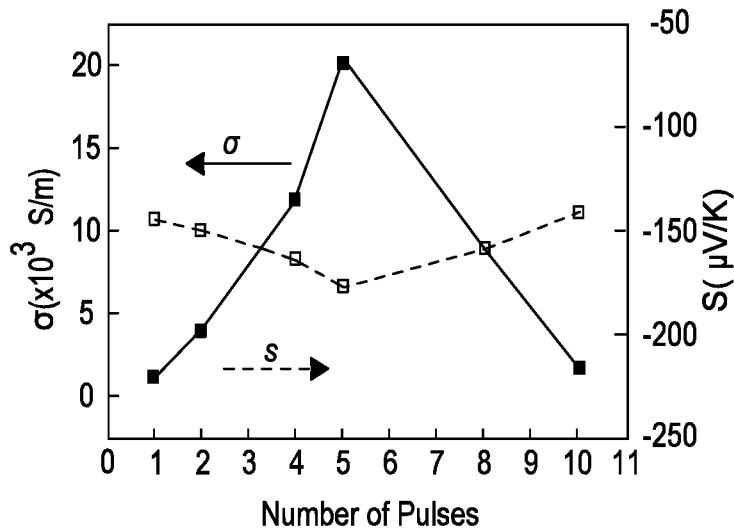
Figure 8F:
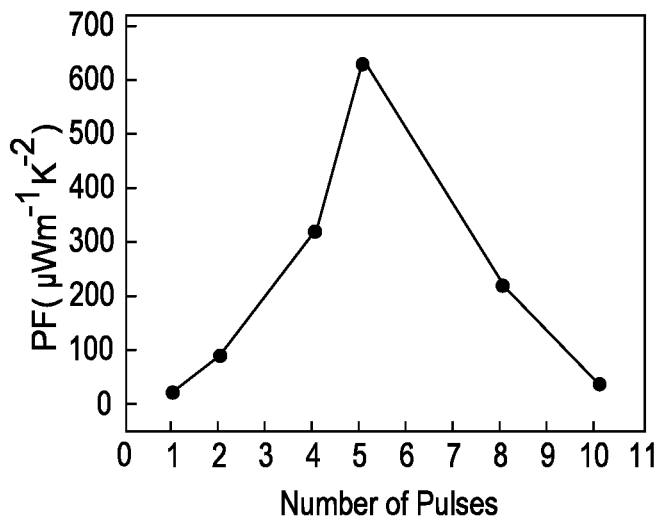

The physical mechanism of intense pulsed light sintering was further studied from viewpoints of microstructure and charge carrier properties. As can be seen in FIG. 7A, the printed $Bi_2Te_{2.7}Se_{0.3}$ films prior to sintering show a network of nanoplates isolated by the insulating PVP surfactant at the particle interfaces, which explains the observed infinite resistivity of the unsintered films. A single pulse is sufficient to remove most of the surfactant, but results in a porous microstructure, which limits the carrier mobility, as shown in FIG. 7B. With continued energy input (FIG. 7C-7D) the grain size grows and porosity decreases as the particles coalesce, forming a well-connected interface, resulting in increased electrical conductivity and PF, as shown in FIG. 7D (showing an example sintered with five pulses). With more than five pulses, the film becomes increasingly porous, e.g., believed to be due to excess energy overheating the film and causing sublimation of the nanoparticle constituents, which is detrimental to charge carrier transport (see FIGS. 7E-7F). FIG. 7G schematically illustrates this evolution of the microstructure of the nanoplate films during photonic pulse sintering.

Figure 9:
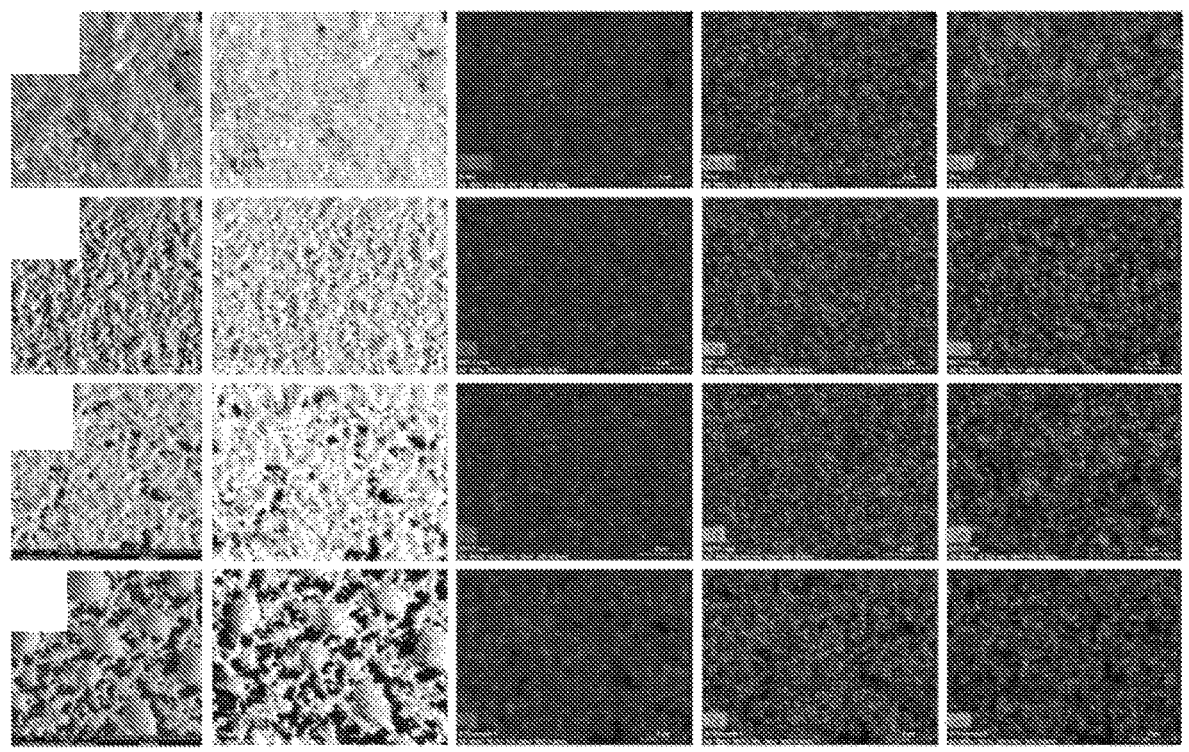
FIG. 9 shows EDS mapping of unsintered film (top row) and photonic sintered films sintered at 5.1 kW/cm$^2$ power density with 1.5 ms pulse duration and 362 ms delay between pulses, with 2 pulses (2nd row), 5 pulses (3rd row), and 8 pulses (4th row).
Figure 10:
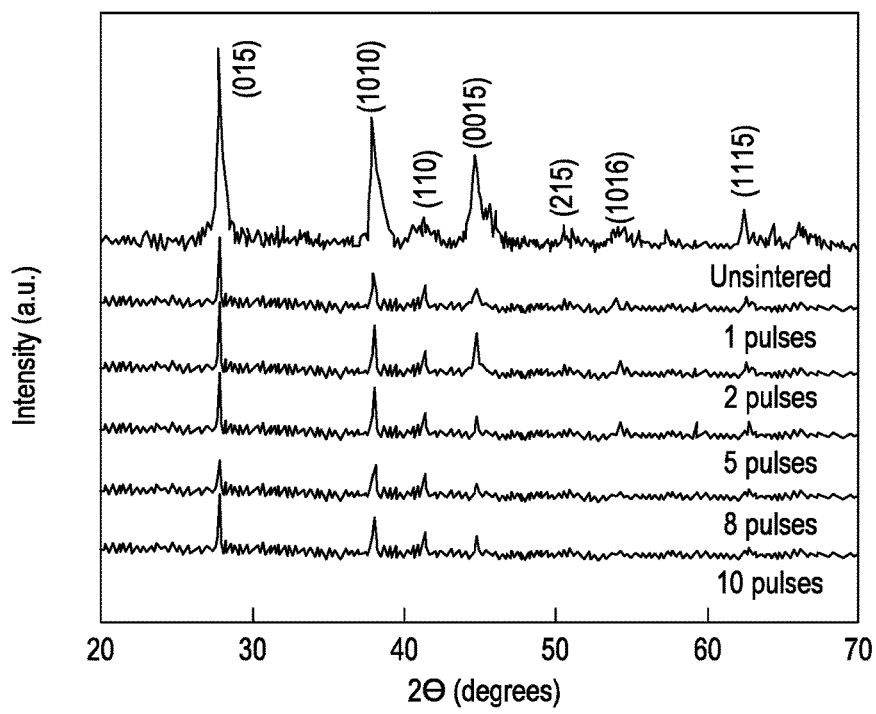
FIG. 10 shows XRD patterns of the same unsintered and sintered $Bi_2Te_{2.7}Se_{0.3}$ samples as FIG. 9, which also correspond to FIGS. 7A-7F. No impurities were found to be introduced during the sintering process under the resolution of XRD. The main peaks become sharper, evidencing the growth of nanoparticles.

Hall effect measurements were carried out to provide insight into the charge carrier transport behavior of the films sintered by IPL. As shown in Table 4, the carrier mobility μ increases dramatically from 8.2 to 25 $cm^2\ V^{-1}\ s^{-1}$ (at 5 pulses) and then drops by almost 50%, at 8 pulses. Here, the increasing mobility can be ascribed to the increased film density and larger grains with decreased grain boundary and pore boundary scattering, as demonstrated in FIGS. 7A-7F. The carrier concentration n is relatively insensitive to the number of pulses, indicating that the films preserve substantially the same composition as the starting nanocrystals, which is confirmed in the corresponding EDS mapping images shown in FIG. 9. The corresponding XRD patterns in FIG. 10 show no noticeable changes of the crystalline structure of the $Bi_2Te_{2.7}Se_{0.3}$ films during the sintering process. Although illustrated particularly with $Bi_2Te_{2.7}Se_{0.3}$, it will be appreciated that various other suitable nanoparticle TE materials could alternatively be employed (e.g., other chalcogenide containing materials that can provide the desired electrical conductivity once sintered).

Table 4 below shows Room-temperature thermoelectric and carrier transport properties of photonic sintered films prepared under a power density of 5.1 kW/cm², 1.5 ms pulse duration and 362 ms pulse delay time with different pulse numbers. Reported characteristics include the Seebeck coefficient (S), electrical conductivity (σ), carrier mobility (μ), carrier concentration (n), and power factor (PF). The energy J is the total amount of energy incident upon the printed film surface during the sintering process.

TABLE 4

| Pulses | Energy (J) | S (μV/K) | σ ($10^3$ S/m) | μ ($cm^2V^{-1}s^{-1}$) | n ($10^{19}cm^{-3}$) | PF ($\mu Wm^{-1}K^{-2}$) |
| --- | --- | --- | --- | --- | --- | --- |
| 1 | 2.3 | −144.8 | 1.15 | 8.2 | 3 | 24.1 |
| 2 | 4.6 | −166.0 | 8.87 | 12.7 | 3.4 | 244.5 |
| 5 | 11.5 | −163.4 | 27.2 | 24.9 | 3.1 | 730.2 |
| 8 | 18.4 | −165.8 | 16.9 | 12.6 | 2.7 | 465.1 |

Figure 11A:
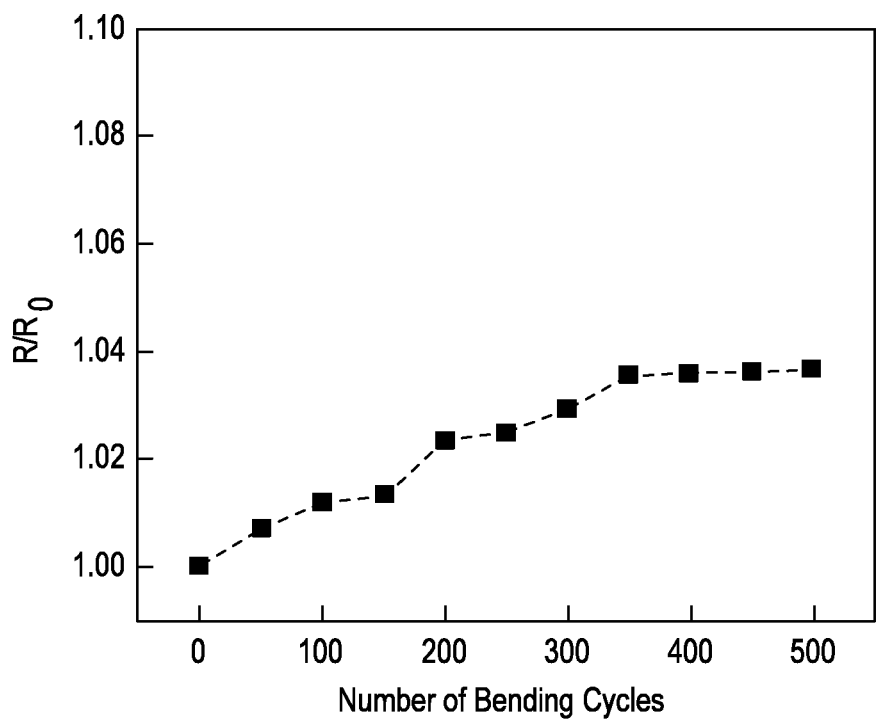
FIGS. 11A-11B show changes to electrical resistance of the photonic sintered $Bi_2Te_{2.7}Se_{0.3}$ thin films on polyimide as a function of number of bending cycles (FIG. 11A), and as a function of bending radius (FIG. 11B).
Figure 11B:
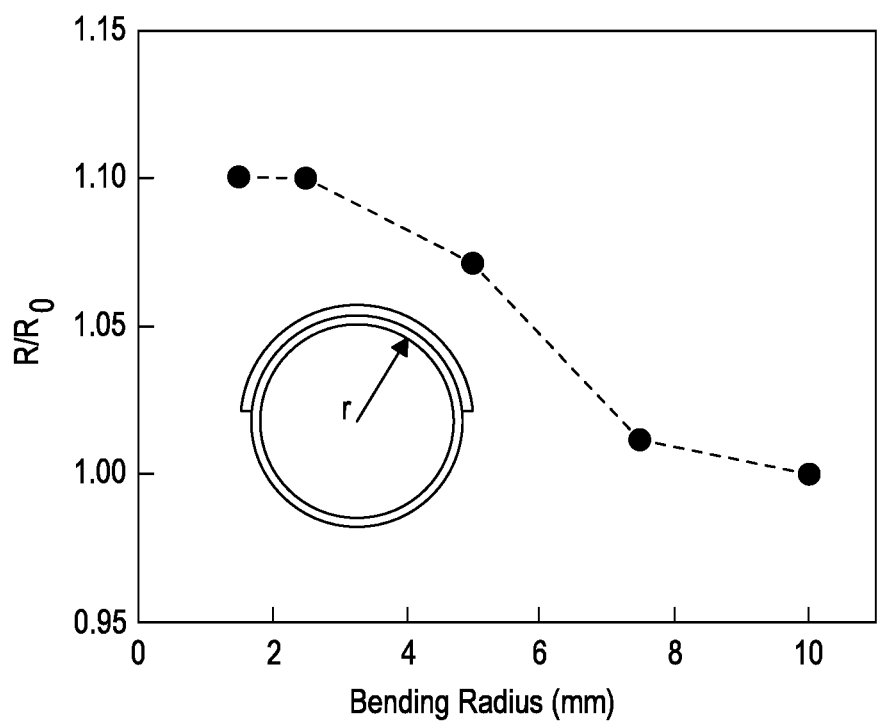

Bending tests were performed to evaluate the mechanical flexibility and robustness of the printed TE films in thermal energy harvesting applications on curved surfaces, particularly flexible surfaces that may undergo repeated bending (e.g., clothing, fabrics, flexible sensors, etc.). As shown in FIG. 11A, the printed films show a slight increase in electrical resistance of about 4% after 500 bending cycles. Bending tests based on different radii were also performed, with an increase of about 10% in electrical resistance at a tight bending radius of 1.5 mm (FIG. 11B).

Figure 12A:
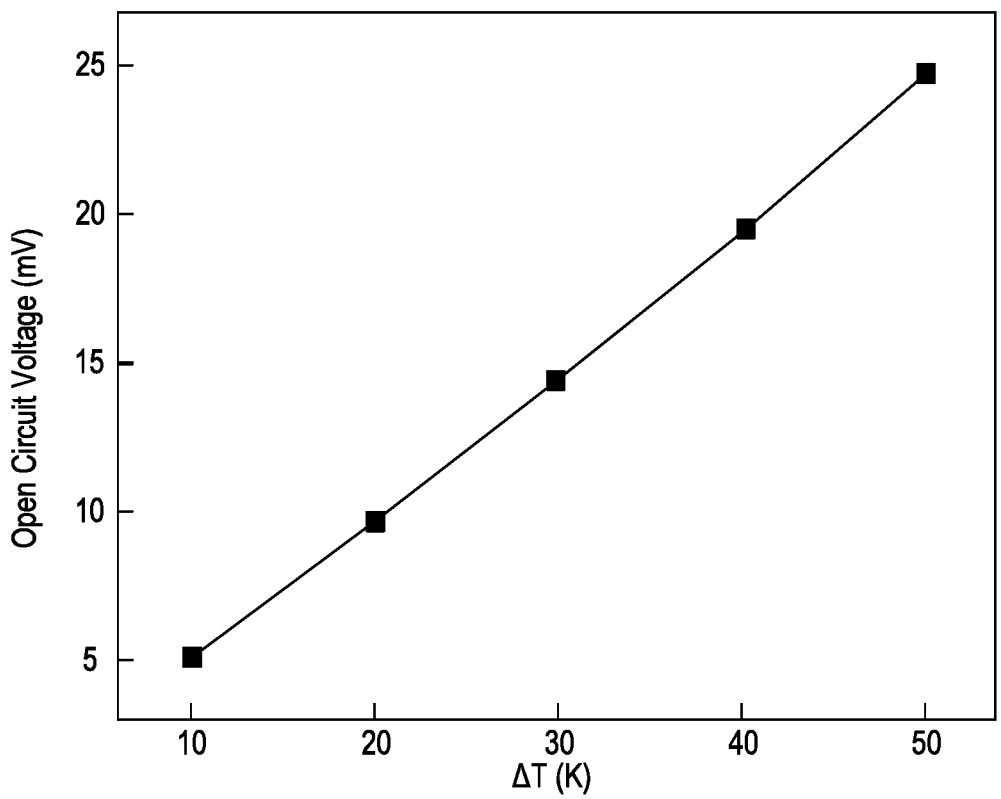
FIGS. 12A-12D show performance of a flexible TE device fabricated using aerosol jet printed $Bi_2Te_{2.7}Se_{0.3}$ films, with FIG. 12A showing open circuit voltage vs. temperature difference ($\Delta T$)
Figure 12B:
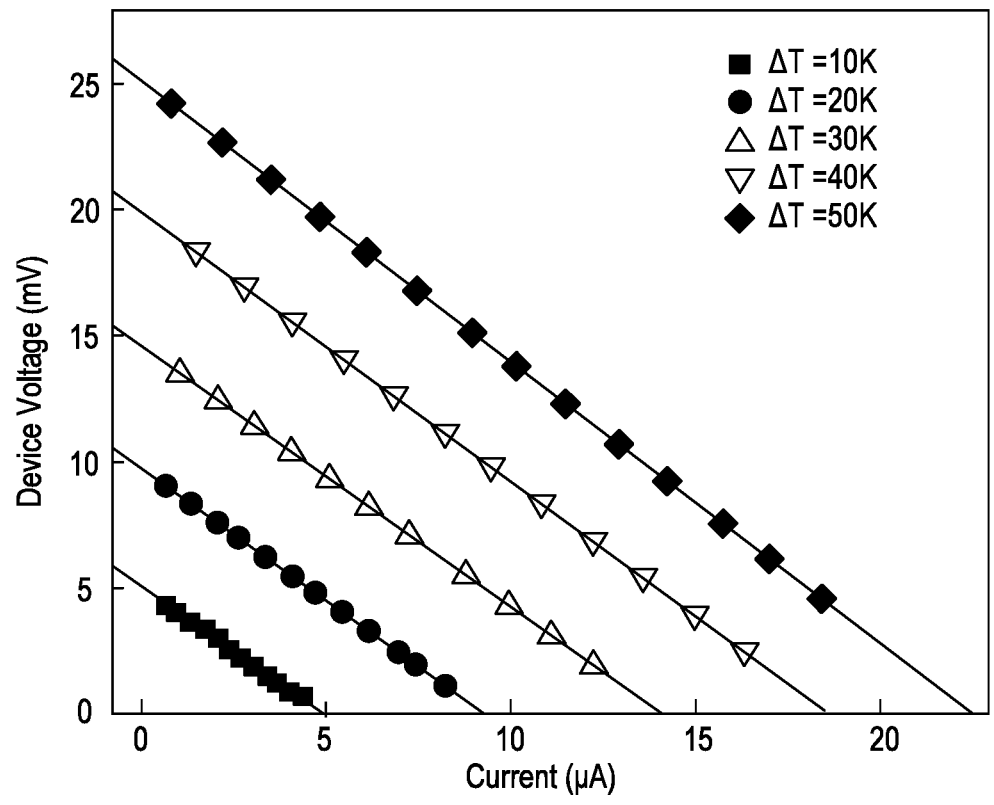
Figure 12C:
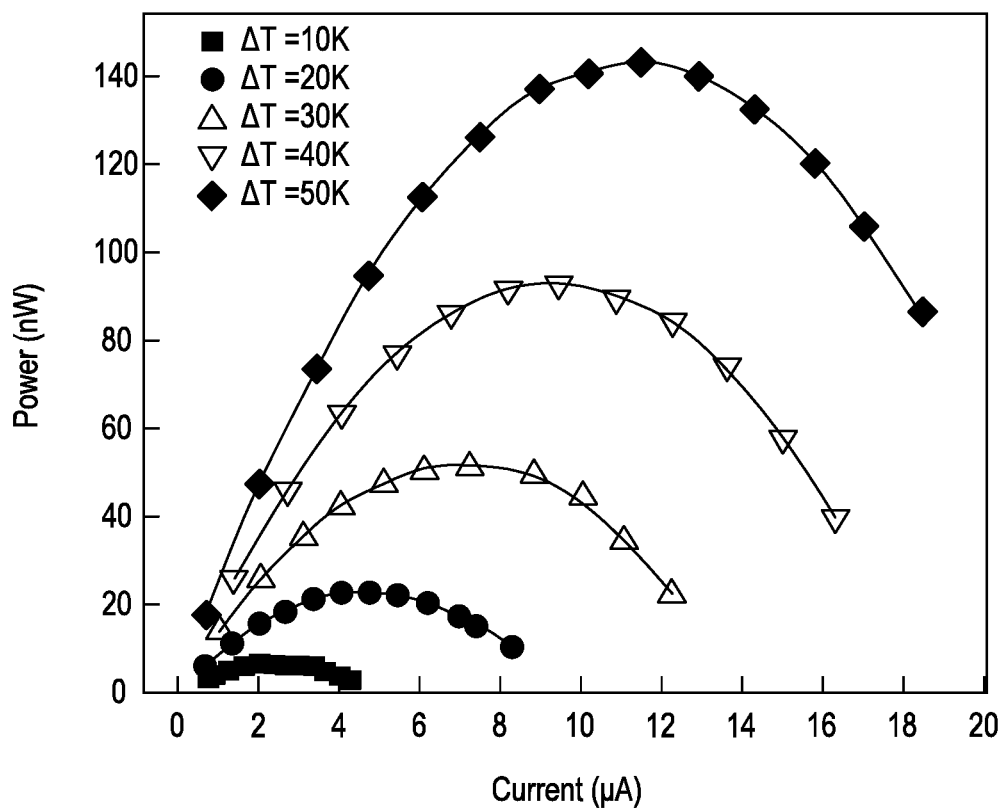
Figure 12D:
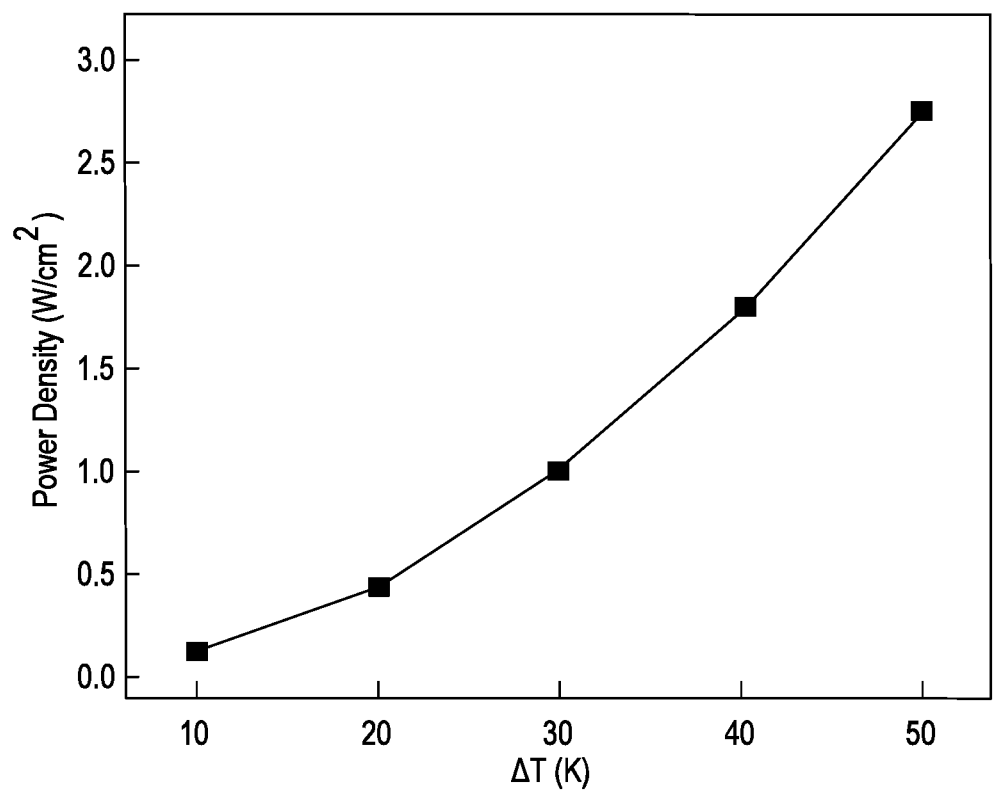

Finally, a flexible TE generator with aerosol jet printed $Bi_2Te_{2.7}Se_{0.3}$ films was tested to demonstrate the potential of the present systems for energy harvesting. FIG. 12A shows that the measured device open circuit voltage increases linearly with temperature difference ($\Delta T$) by virtue of the Seebeck effect, achieving a maximum output voltage of 25 mV at $\Delta T$ of 50 K. FIGS. 12B-12C show the device operating voltage and power output as a function of electrical current tested at different $\Delta T$ values, respectively. A maximum power output of 141 nW was obtained with a $\Delta T$ of 50 K when the external load resistance matches the internal resistance of the device. The device power density increases with $\Delta T$ and reaches 2.7 mW/cm² at a $\Delta T$ of 50K, as shown in FIG. 12D. The power density was evaluated based on the total cross-sectional area of the four TE elements perpendicular to the heat flow direction. It should be noted that only 4 printed TE film elements were used in the fabricated inplane device, and the device power output can be increased by increasing the number of TE elements (e.g., any desired number of elements could be provided, whether in series or parallel).

The present disclosure presents the first demonstration of aerosol jet printing of nanoparticle thermoelectric inks coupled with ultrafast photonic sintering to create flexible, high-performance and low-cost thermoelectric films. Using intense pulsed light sintering, the electrical conductivity of non-conductive n-type $Bi_2Te_{2.7}Se_{0.3}$ film is improved to $2.7 \times 10^4$ S/m within a few seconds. Achieving a power factor of 730 $\mu W m^{-1} K^{-2}$ at room temperature within 1.5 seconds of initiating sintering is unprecedented, allowing highly scalable roll-to-roll printing of TE devices on a wide variety of low-temperature substrates, as well as directly printing TE devices onto 3D curved surfaces, whether flexible or not. The 3D conformal aerosol jet printing combined with ultrafast photonic sintering opens up exciting opportunities to transform semiconducting nanocrystals into functional and flexible devices for broad industrial and personal applications.

In addition to the various embodiments described above, the present invention is also directed to other solution-processable semiconducting TE materials. For example, 2D nanoplates and 1D nanorods are attractive building blocks for diverse technologies, including thermoelectrics, optoelectronics, and electronics. However, as noted above, transforming solution-processable colloidal nanoparticles into high-performance and flexible devices remains a challenge. As already noted, flexible films prepared by solution processed semiconducting nanocrystals are typically plagued by poor thermoelectric and electrical transport properties. The present disclosure also provides a highly scalable 3D conformal additive printing approach to directly convert solution-processed 2D nanoplates and 1D nanorods into high-performing flexible devices. The flexible films printed using $Sb_2Te_3$ nanoplates as described herein demonstrated an exceptional thermoelectric power factor of 1.5 mW/m·K² over a wide temperature range (e.g., 350-550 K). By synergistically combining $Sb_2Te_3$ 2D nanoplates with Te 1D nanorods, the power factor of the flexible film reached an unprecedented maximum value of 2.2 mW/m·K² at 500 K, which is significantly higher than the best reported values for p-type flexible thermoelectric films. A fully printed flexible generator device exhibited a competitive electrical power density of 7.65 mW/cm² with a reasonably small temperature differential of 60 K. The versatile printing method for directly transforming nanoscale building blocks into functional devices paves the way for developing not only flexible energy harvesters but also a broad range of flexible/wearable electronics and sensors.

Flexible thermoelectric generators (f-TEGs) based on materials such as $Sb_2Te_3$ and $Bi_2Te_3$, carbon nanotube, graphene, conductive polymer and hybrids, have the ability to interconvert thermal to electrical energy without moving parts. These f-TEGs can be integrated with portable/wearable electronics and sensors and enable self-powered devices. In this context, $V_2$—$VI_3$ metal chalcogenides (e.g., $Bi_2Te_3$, $Sb_2Te_3$ and related alloys and compounds) have attracted particular attention because of their high figure of merit (ZT) near room temperature. For example, p-type $Bi_2Te_3$—$Sb_2Te_3$ alloys show high performance near room temperature and benefit considerably from nano-structuring.

Similar to $Bi_2Te_3$, $Sb_2Te_3$ is also a topological insulator, which leads to a complex, nonparabolic band structure, often highly favorable for thermoelectric performance. It has an extremely high dielectric constant of $\varepsilon_0 \sim 100$, favorable for high mobility even with a large concentration of defects. Thus, $Sb_2Te_3$ is potentially an important TE material, the key challenge being to find methods to control its carrier concentration and to effectively nanostructure the material while maintaining this control. Up to now, most of the reported $Sb_2Te_3$ related materials are p-type semiconductors, which is determined by its intrinsic defects including Sb vacancies and anti-site defects of Sb atoms on the Te sites ($Sb_{Te}$). Typically, $Sb_2Te_3$ bulk single crystals stand out for their unique advantages including a high electrical conductivity ($\sigma$) of about $3 \times 10^5$ S/m to $5 \times 10^5$ S/m, and a reasonable thermal conductivity ($\kappa$) around 1~6 W/m·K. However, $Sb_2Te_3$ also has a less competitive Seebeck coefficient (S), of about 83-105 $\mu$V/K arising from its high degenerate hole concentration ($n > 10^{20}$ cm$^{-3}$) created by the acceptor state mentioned above, especially $Sb_{Te}$.

Nanostructuring has been employed to enhance S, and to reduce $\kappa$ as a result of the increased phonon scattering effect. For example, $Sb_2Te_3$ with 2D nanoplate morphology presents a 30% increase in S (S=125 $\mu$V/K) near room temperature. S and ZT enhancement in nanostructured $Sb_2Te_3$ by anti-site defect suppression through sulfur doping was also achieved in nanobulk thermoelectrics. Bi—Te and Sb—Te solid solutions (e.g. $Bi_{0.5}Sb_{1.5}Te_3$) also increase S (S>170 $\mu$V/K at 450 K) and suppress $\kappa$. Unfortunately, the reduced band gap limits the ability of the Bi—Sb—Te system to retain high ZT above 450 K. Despite the high ZT (e.g., >1) observed in the Bi—Sb—Te system, the ZT normally peaks at narrow temperature range near or below 100° C. It has been a challenge to develop materials with consistently high ZT across a broad temperature plateau. Meanwhile, there is also an absence of high ZT materials in the middle temperature range (200-300° C., i.e., 473-573 K) where the majority of available waste heat resides.

Although TE nanostructures with enhanced ZT have been extensively studied, a big gap exists in translating these nanostructures into high-performance and flexible TE devices. The majority of reported TE devices were fabricated by exploiting the above-mentioned inorganic nanostructures into bulk configurations. However, rigid bulk devices not only consume large amounts of TE materials but also present challenges in applications on curved, and particularly flexible surfaces such as the human body, other flexible surfaces, or even exhaust pipes. According to the present disclosure, a highly scalable 3D conformal aerosol jet printing method is provided to fabricate flexible TE generators using metal-chalcogenide nanostructures as building blocks. The spatial resolution of the aerosol jet printing may be about 20 μm in the lateral dimension and several hundred nanometers in film thickness. Printed flexible $Sb_2Te_3$ films demonstrated herein can have exceptional average power factor (PF), for example, of 1.5 mW/m·$K^2$ across a wide temperature plateau (e.g., from 350-550 K). The PF can be further increased to 2.2 mW/m·$K^2$ at 500 K by including excess Te (e.g., Te nanorods) with the $Sb_2Te_3$ nanoplates, e.g., as a composite material of the two. A fully printed flexible TE generator exhibited a power density of 7.65 mW/$cm^2$ under a temperature gradient of 60 K, demonstrating great potential to power wearable electronics and sensors.

Figure 13A:
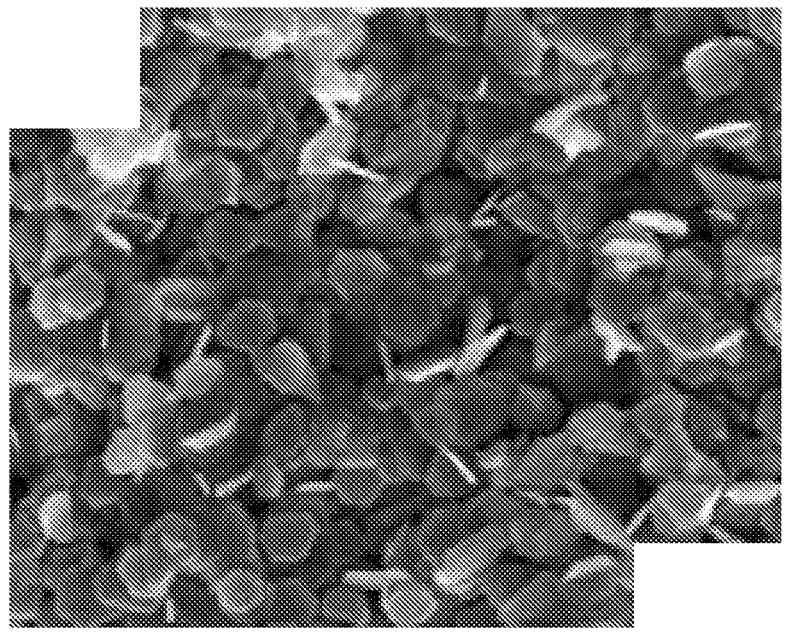
FIG. 13A shows a SEM image of $Sb_2Te_3$ nanoplates.
Figure 13B:
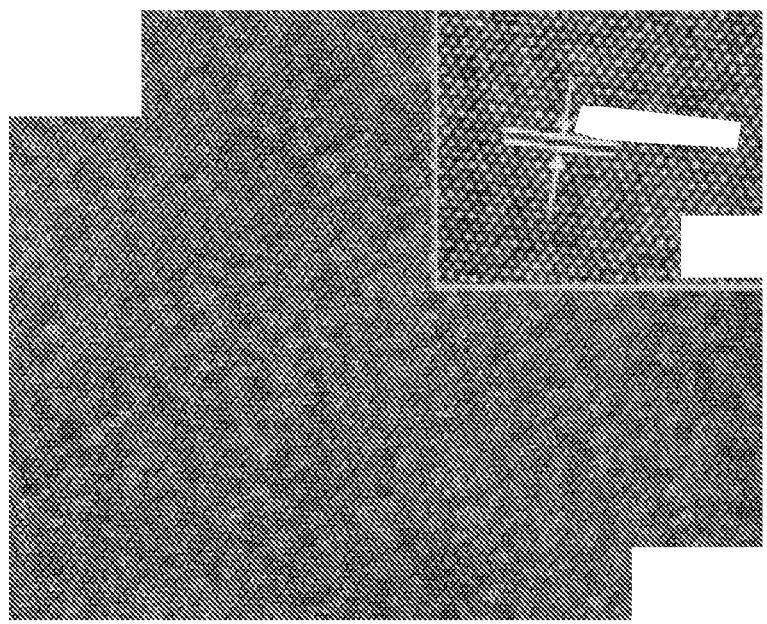
FIG. 13B shows an HRTEM image of the $Sb_2Te_3$ nanoplates of FIG. 13A.
Figure 14:
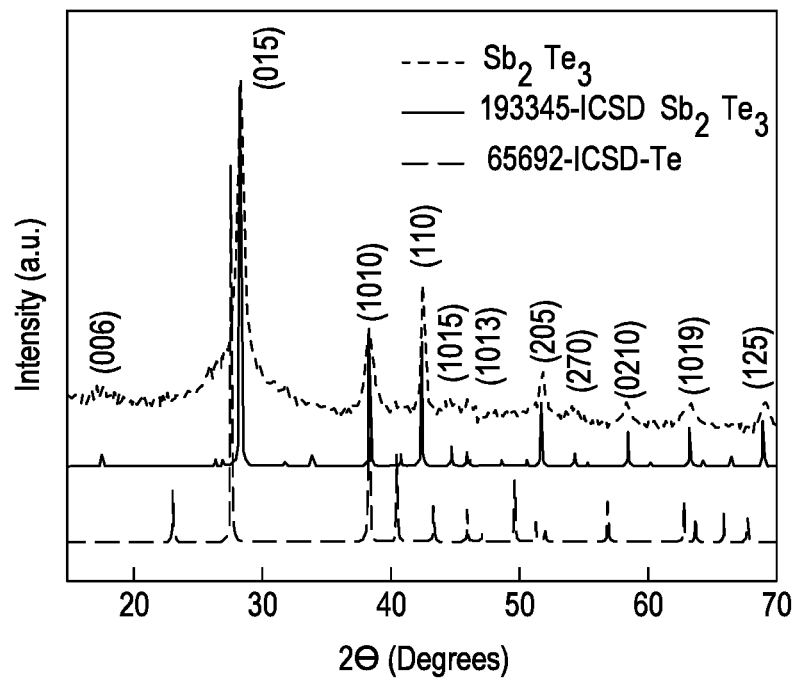
FIG. 14 shows Powder X-ray diffraction (XRD) characterization of pure $Sb_2Te_3$ product before sintering, as well as standard XRD patterns for $Sb_2Te_3$ and Te, for comparison. The peaks corresponding to the rhombohedral $Sb_2Te_3$ phase as labeled by the Miller indexes. No noticeable appearance of Te phase was observed.
Figure 15:
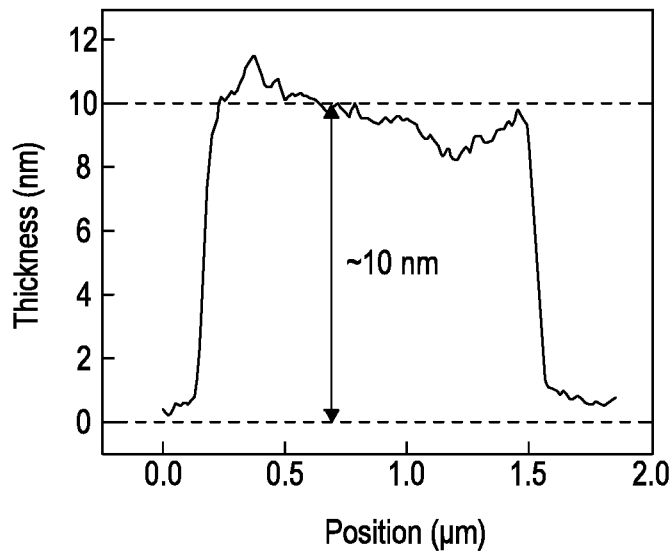
FIG. 15 shows atomic force microscopy (AFM) characterization of a pure 2D $Sb_2Te_3$ nanoplate. The average thickness of the plate is determined to be about 10 nm.

$Sb_2Te_3$ nanoplates were fabricated using a simple energy-saving hydrothermal method (See details in the examples section). FIG. 13A-13B show the SEM and HRTEM images of the 2D $Sb_2Te_3$ nanoplates with high crystallization. The lattice spacing of 0.209 nm corresponds to the lattice planes (110) in $Sb_2Te_3$. FIG. 14 presents the powder X-ray diffraction (XRD) pattern of the as-fabricated $Sb_2Te_3$ plates, together with the major diffraction peaks which correspond to rhombohedral $Sb_2Te_3$ phase (R3m, JCPDS No. 15-0874). No noticeable appearance of a separate Te phase was observed. The average thickness of the plate was determined as 10 nm by atomic force microscopy (AFM) analysis, with lateral size of the plates being from about 1 to 1.5 μm (FIG. 15). This highly anisotropic growth is believed to be due to the inherent crystal structure of the material. The as-fabricated $Sb_2Te_3$ nanoplates were cleaned with hydrazine hydrate and redispersed in a mixture of ethylene glycol (EG), glycerol and ethanol having a ratio of 35:5:60 by weight. The remaining PVP surfactant helps prevent the nanoplates from prematurely aggregating, and the surfactant can be removed in the sintering process which follows application of the ink composition to the substrate.

The same conformal aerosol jet printing process described in conjunction with FIG. 1C can be used to apply ink compositions including $Sb_2Te_3$ nanoplates. Similar to Table 1, Table 5 below shows exemplary parameters that can be used to print such an ink (e.g., $Sb_2Te_3$, $Sb_2Te_3$—Te, or other semiconductor chalcogenide nanoparticle ink compositions). Of course, various other values may also be suitable for use (e.g., ±50% from those shown).

TABLE 5

| Parameter | Value |
| --- | --- |
| $Sb_2Te_3$ or other TE nanoparticles (wt %) | 20 |
| Nozzle Diameter (μm) | 150 |
| Line Spacing (μm) | 15 |
| PA Atomizer flow (sccm) | 550 |
| Exhaust Flow (sccm) | 500 |
| Sheath Gas Flow (sccm) | 12 |
| Platen Temperature (° C.) | 70 |
| Process Speed (mm/s) | 5 |

Figure 13C:
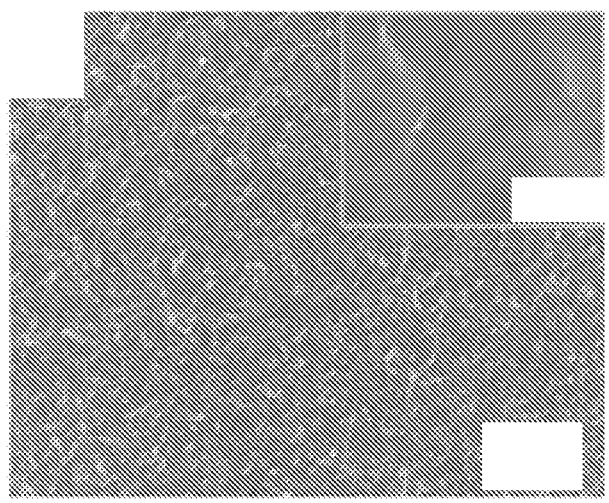
FIG. 13C shows an SEM image of a $Sb_2Te_3$ film on a polyimide substrate, after sintering at 400° C. for 1 hour.
Figure 13D:
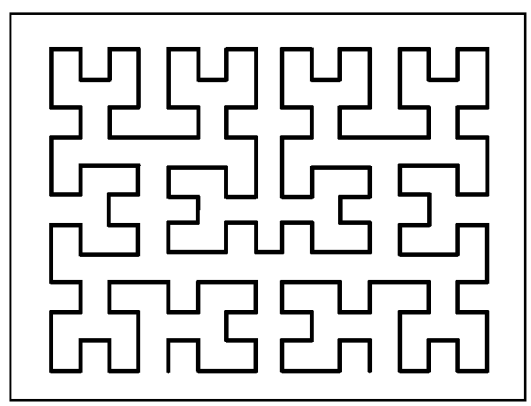
FIG. 13D shows an example of the complex, intricate printed traces that can be prepared, using the present processes, with microscale resolution.

The synthesized ink composition with 20% inorganic TE particles exhibits high stability, e.g., printable for at least 3 months after synthesis. Using the nanocrystal or nanoparticle ink, TE films with virtually any desired pattern can be produced using the present methods, whether applied onto flat or curved surfaces, and whether such surfaces are rigid or flexible. The film thickness can be adjusted by adjusting the ink composition, the mass flow rate, and number of printing passes. For example, a dense and continuous $Sb_2Te_3$ thin film (thickness of about 1.5 μm) can be printed on polyimide or other desired substrate material, with competitive internal resistance while maintaining excellent flexibility. FIG. 13C shows the corresponding SEM image after sintering of such an embodiment, revealing well connected $Sb_2Te_3$ networks that facilitate efficient charge carrier transport across neighboring nanoplates. Films with variously designed patterns were printed on various substrates, including intricately printed tracery patterns, application of thin-film patterns printed on a cylindrical tube, and others, demonstrating the high resolution and 3D conformal printing ability of the present approach.

Sintering (whether photonic, thermal, or otherwise) plays an important role in removing the surfactant and consolidating the relatively loose nanoparticle assembly into a densified continuous network. While photonic sintering is described above, in this example, thermal sintering, at a temperature of 400° C. was used in order to decompose and remove the PVP surfactant, as well as drive off any carrier or solvent present in the ink. Of course, temperatures varying from the 400° C. can also be used. It is advantageous that such sintering temperature be no more than 400° C., although it will be appreciated that higher temperatures can also be used, (e.g., up to 600° C., or up to 500° C.). That said, it is advantageous for sintering to be achieved at temperatures of 400° C. or less, as many substrate materials cannot be exposed to such elevated temperatures without damage.

In an embodiment, it may be advantageous for the sintering to occur at a temperature not more than 250° C., no more than 200° C., no more than 150° C., no more than 100° C., or not more than 50° C. higher than the environmental temperature in which the waste heat is to be harvested.

Figure 16A:
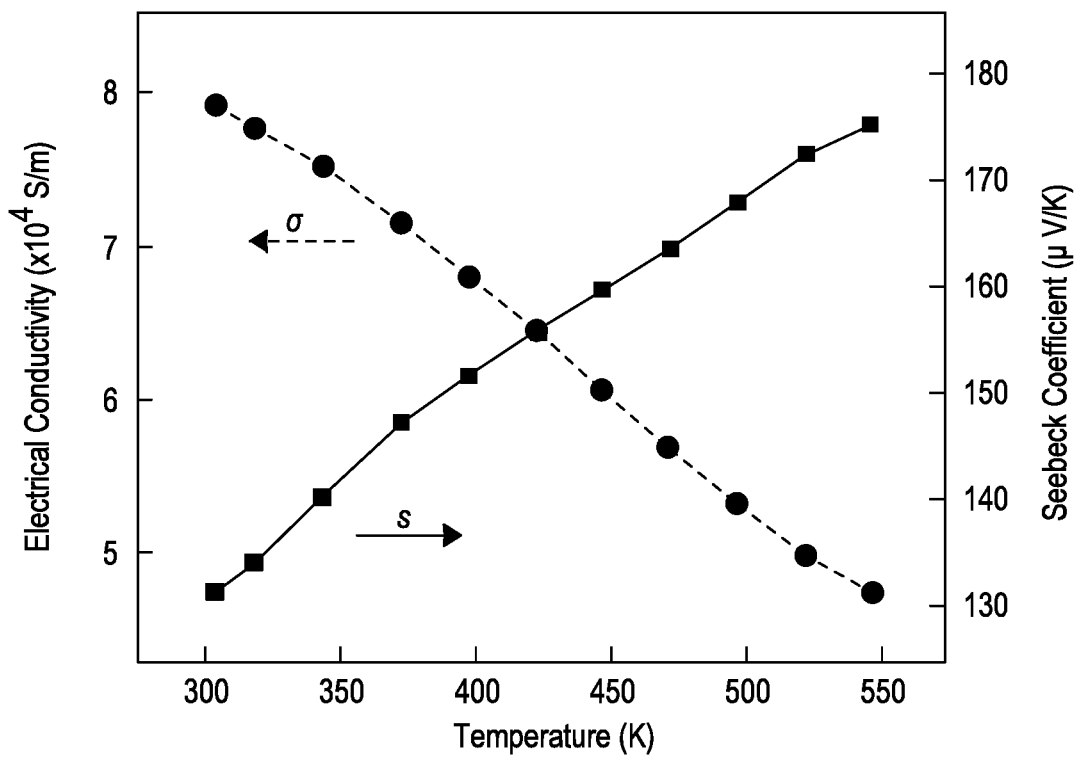
FIGS. 16A-16B show temperature dependent in-plane TE properties (FIG. 16A shows electrical conductivity and Seebeck coefficient, and FIG. 16B shows power factor) of flexible $Sb_2Te_3$ films printed on polyimide after sintering at 400° C. A high-power factor over a wide temperature range (350-550 K) was achieved. The inset in FIG. 16B shows the excellent flexibility of the film under repeated bending tests, with $R_0$ being the original resistance of the film and r being the bending radius.
Figure 17A:
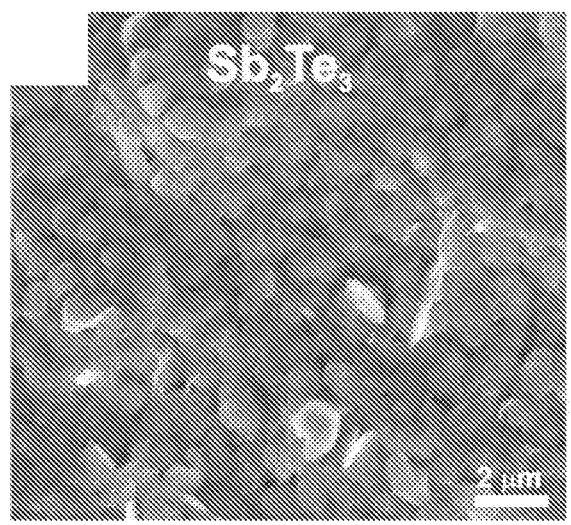
FIGS. 17A-17D show SEM images and Energy-dispersive X-ray spectroscopy (EDS) characterization of $Sb_2Te_3$ films (FIGS. 17A-17B) and $Sb_2Te_3$—Te composite films (FIGS. 17C-17D). The Te-rich composite film has about 8 wt % Te more than the standard stoichiometric ratio of pure $Sb_2Te_3$.
Figure 17B:
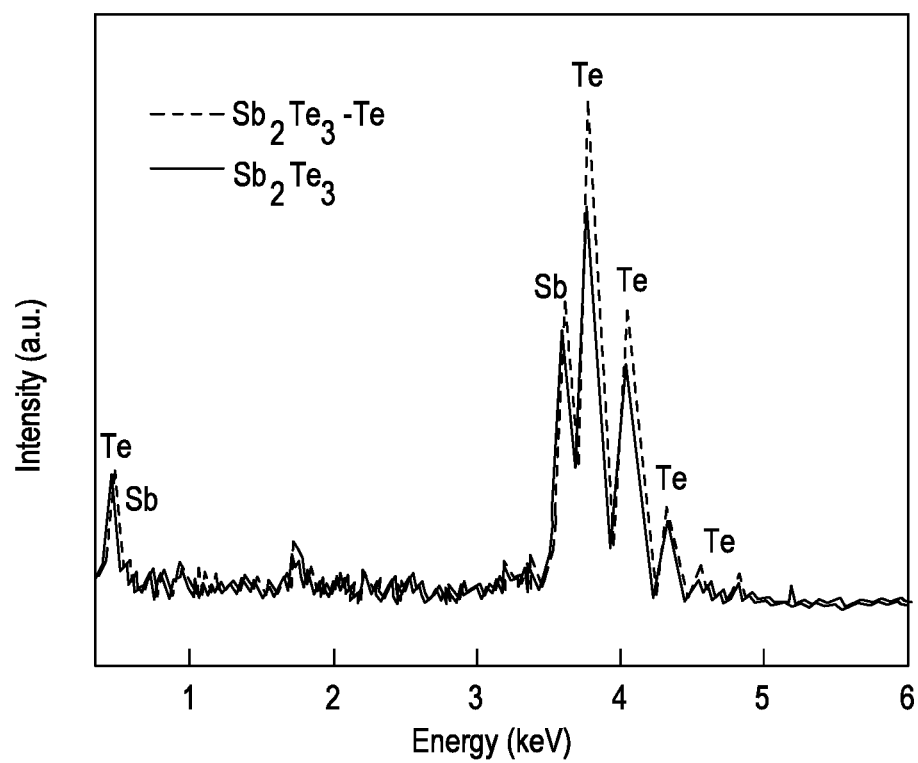

FIG. 16A shows the temperature dependent electrical conductivity σ and Seebeck coefficient S measured along the in-plane direction of the sintered film. The film shows degenerate semiconducting behavior of decreasing σ with temperature, which is typical for $Sb_2Te_3$ nanostructures after sintering. The σ is lower than that of the single-crystal bulk counterpart due to the electron scattering at the nano-grain boundaries. Nevertheless, the room-temperature σ reaches 7.8×$10^4$ S/m, which is among the highest reported values for printed TE films. The carrier concentration (p) and mobility (μ) were determined by Hall measurement to be 1.06×$10^{20}$ $cm^{-3}$ and 48.5 $cm^2V^{-1}$ $s^{-1}$, respectively. The high carrier concentration is in agreement with the Te-deficient defects as verified by energy-dispersive X-ray spectroscopy (EDS) analysis (FIG. 17A-17B and Table 6, below).

TABLE 6

| Sample | Element | Weight % | Atomic % |
| --- | --- | --- | --- |
| $Sb_2Te_3$—Te | Sb | 34.9 | 36.0 |
|  | Te | 65.1 | 64.0 |
| $Sb_2Te_3$ | Sb | 40.7 | 41.8 |
|  | Te | 59.3 | 58.2 |

Figure 16B:
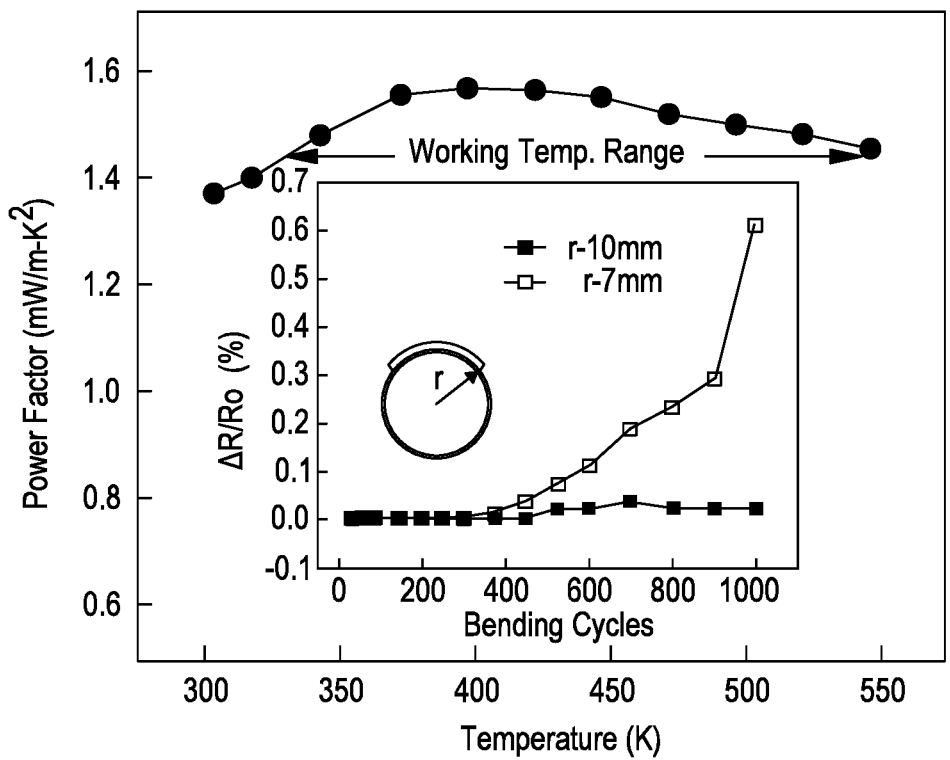

The Seebeck coefficient S also shows degenerate semiconductor behavior, i.e., S increases with increasing temperature. The room-temperature S of 130 μV/K, is over 30% higher than that of the single-crystal bulk counterpart. The temperature dependent power factor (PF) is shown in FIG. 16B, demonstrating a competitive value around 1.37 mW/m·K² at room temperature. It is noteworthy that the PF shows an average value of 1.5 mW/m·K² over a wide temperature plateau (350-550 K), which is promising for harvesting waste heat which is abundant in this low-to-middle temperature range. The flexibility of the film was also studied using various bending tests under different radius curvatures. A slight increase of 0.6% in electrical resistance was observed after 1000 bending cycles at bend radius of 7 mm, demonstrating excellent flexibility for films printed using embodiments as disclosed herein.

A nanocomposite of mixed 2D $Sb_2Te_3$ plates and 1D Te nanorods was also prepared, having even further improved TE properties. When the atomic percent of Te precursor was over 60 at %, the excess Te was segregated from stoichiometric $Sb_2Te_3$ phase as a crystalline Te phase. XRD characterization of the nanocomposite is provided in FIG. 18. The formation mechanism of nanostructure $Sb_2Te_3$ is

$$TeO_2 + N_2H_4 = Te + N_2\uparrow + 2H_2O \qquad (1)$$

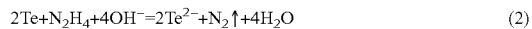

$$2Te + N_2H_4 + 4OH^- = 2Te^{2-} + N_2\uparrow + 4H_2O \qquad (2)$$

$$2Sb^{3+} + 3Te^{2-} = Sb_2Te_3 \qquad (3)$$

In other words, $TeO_2$ is first reduced to $Te^{2-}$ ions with metal ions ($Sb^{3+}$) remaining unchanged, after which $Te^{2-}$ and $Sb^{3+}$ react to generate the telluride product. This means that 1D-Te nanostructures, which are an intermediary product, may act as a template during the early stage of fabrication. $Sb_2Te_3$ with 2D plate-like morphology are developed if 1D rod-like Te templates were destroyed in step (2) under alkaline conditions at proper temperature (e.g., about 155° C.). Otherwise, Te with 1D rod-like morphology is preserved where there is excess Te precursor. By appropriately controlling the amount of reducing agent ($N_2H_4 \cdot H_2O$) and the precursors $TeO_2$, pure 2D $Sb_2Te_3$ and Te-rich 2D/1D $Sb_2Te_3$—Te composites can be obtained.

Figure 17C:
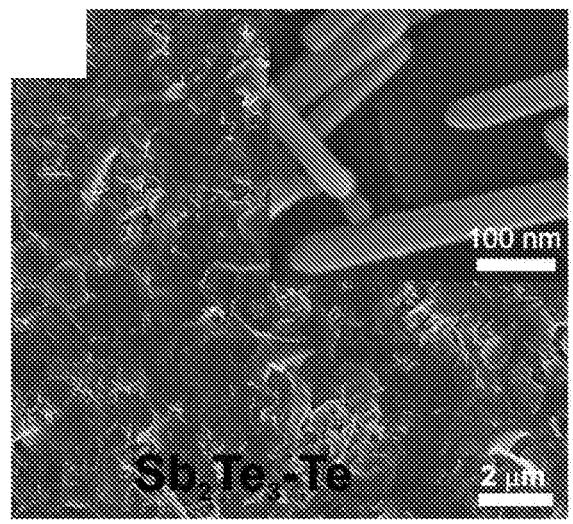
Figure 17D:
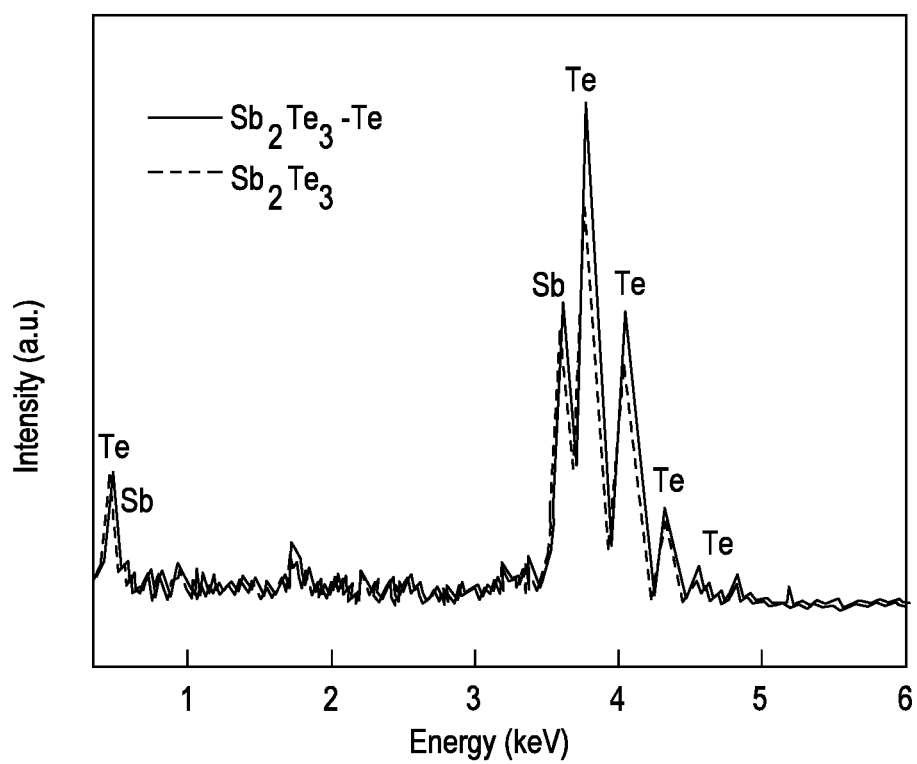
Figure 18:
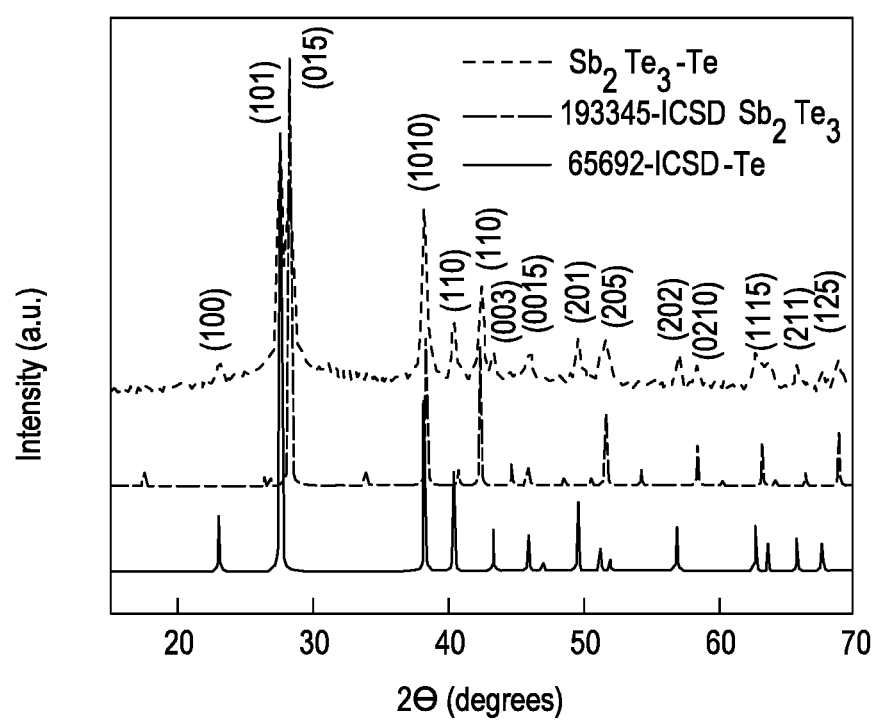
FIG. 18 shows Powder X-ray diffraction (XRD) characterization of $Sb_2Te_3$—Te product before sintering, showing the appearance of trigonal Te phase. The standard XRD patterns for $Sb_2Te_3$ and Te are also given for comparison.
Figure 19A:
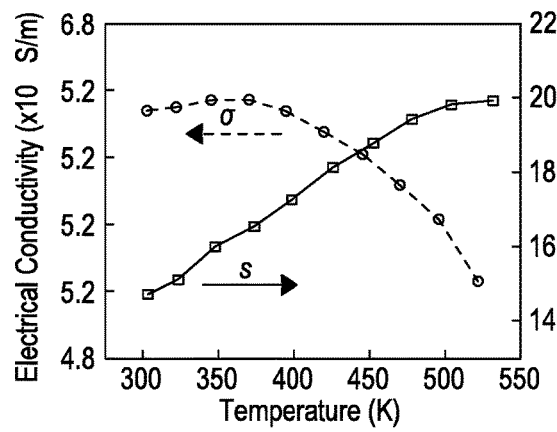
FIGS. 19A-19B show temperature dependent in-plane TE properties, including electrical conductivity and Seebeck coefficient (FIG. 19A) and power factor (FIG. 19B) of the flexible $Sb_2Te_3$—Te composite film printed on polyimide after sintering at 400° C.
Figure 19B:
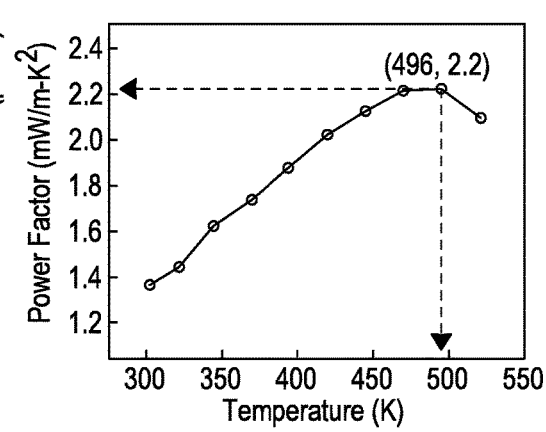
Figure 20A:
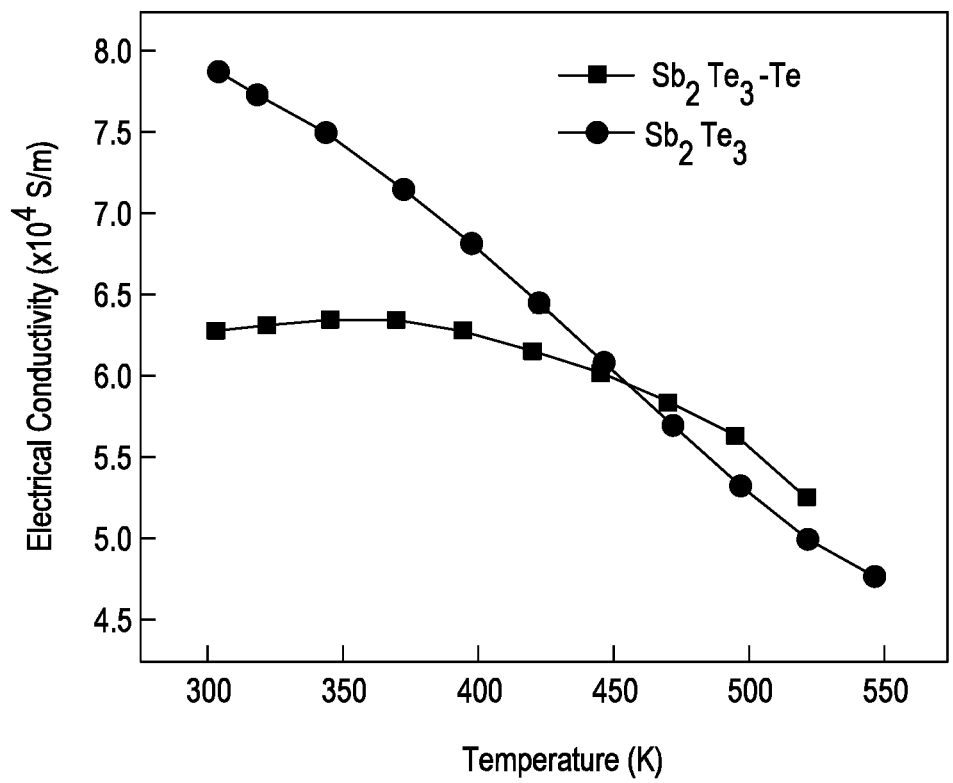
FIGS. 20A-20C show a comparison of TE performance between $Sb_2Te_3$ and 8 wt % Te-rich $Sb_2Te_3$—Te films, showing particularly electrical conductivity (FIG. 20A), Seebeck coefficient (FIG. 20B) and power factor (FIG. 20C).
Figure 20B:
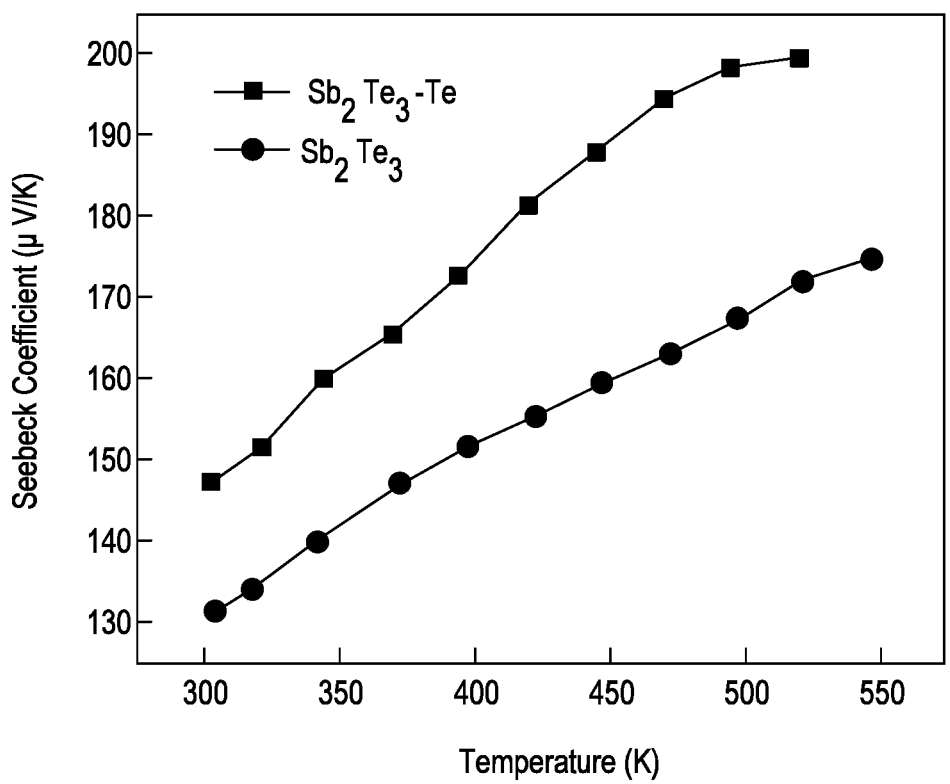
Figure 20C:
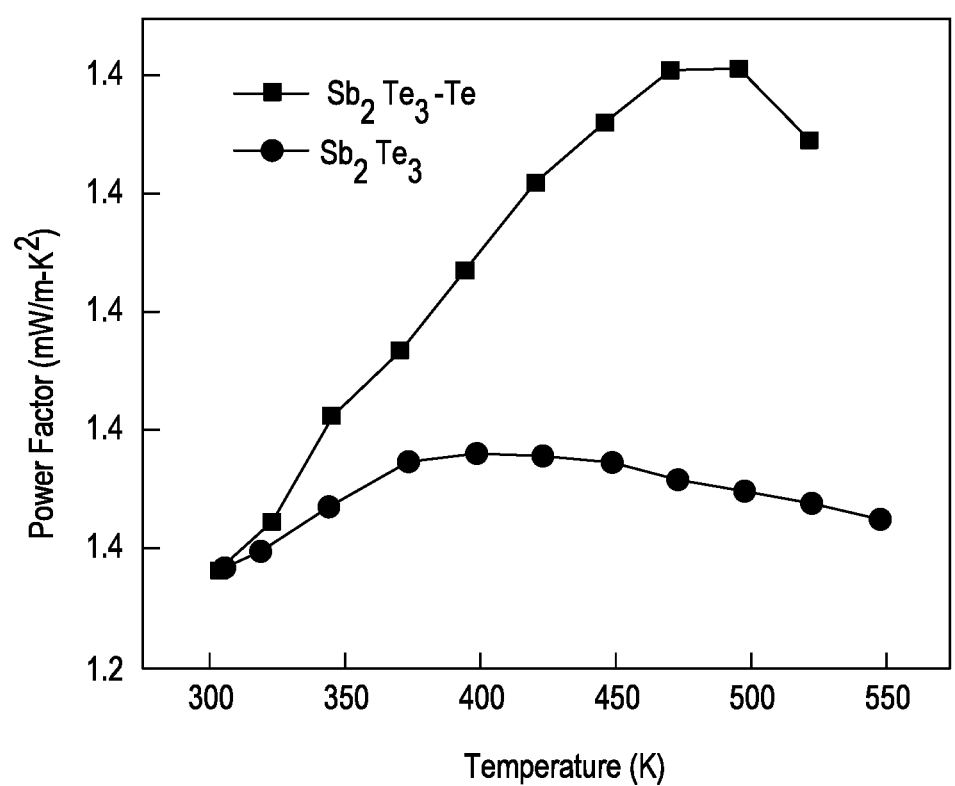

In the case of the $Sb_2Te_3$—Te composite, several Te peaks were observed beyond the XRD pattern of $Sb_2Te_3$, as shown in FIG. 18. About 8 wt % excess tellurium was found in the form of tellurium nanorods based on EDS analysis and SEM characterization (FIG. 17C-17D and Table 6). Related temperature-dependent TE properties are presented in FIGS. 19A-19B. Similar to the pure $Sb_2Te_3$ films, σ also decreases with the increasing temperature after a slight increase below 350 K. The room-temperature S shows a 13.5% increase from 130 to 147 μV/K, and the room-temperature PF maintains almost the same value as the pure $Sb_2Te_3$ film despite a small decrease in σ with Te addition. The S of $Sb_2Te_3$—Te nanocomposite film keeps increasing to about 200 μV/K at 525 K (FIG. 19B), which is about 16.3% higher than that of the $Sb_2Te_3$ film (about 172 μV/K). Meanwhile, the σ of the $Sb_2Te_3$—Te film also surpasses that of the pure $Sb_2Te_3$ film when temperature exceeds 450 K. Comparison of the TE properties between $Sb_2Te_3$ and $Sb_2Te_3$—Te films is given in FIGS. 20A-20C. As a result, the PF of the $Sb_2Te_3$—Te film continues to increase substantially linearly and reaches a peak value of 2.2 mW/mK² at around 500 K, 46.7% higher than that of the $Sb_2Te_3$ film. This composite-based film not only can serve as a power source for flexible electronics around room temperature (as can the pure $Sb_2Te_3$ film), but also fills a gap in the absence of high-performance and cost effective TE materials in the low-medium temperature range around 400-500 K.

Figure 19C:
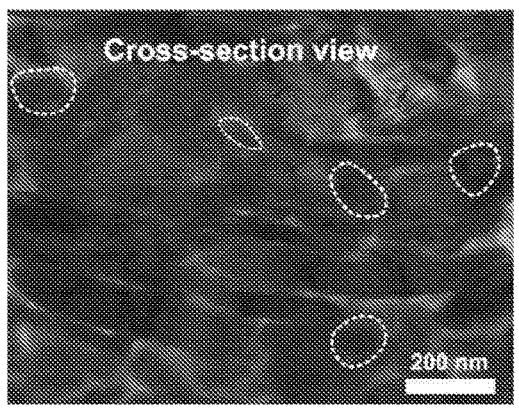
FIGS. 19C-19D show a TEM image (FIG. 19C) and a HRTEM image (FIG. 19D) of the interface between Te and $Sb_2Te_3$ from a cross-plane viewpoint of the printed film. The marked dashed circles mark the existence of additional Te nanorods. Local EDS and element line-scan analysis is given in FIGS. 21B-21C and Table 7.
Figure 19D:
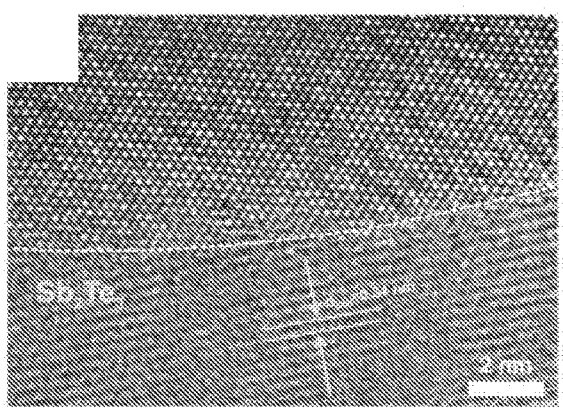
Figure 21A:
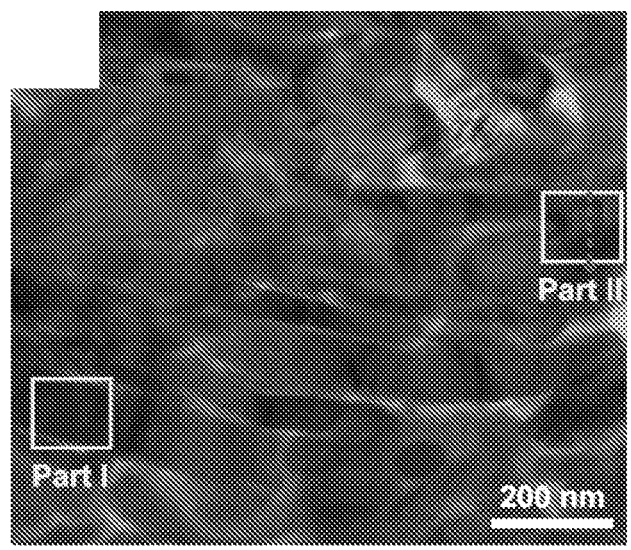
FIGS. 21A-21C show an SEM image (FIG. 21A) and local EDS analysis (FIGS. 21B-21C and Table 7) on $Sb_2Te_3$—Te films at different positions corresponding to those marked in FIG. 21A.
Figure 21B:
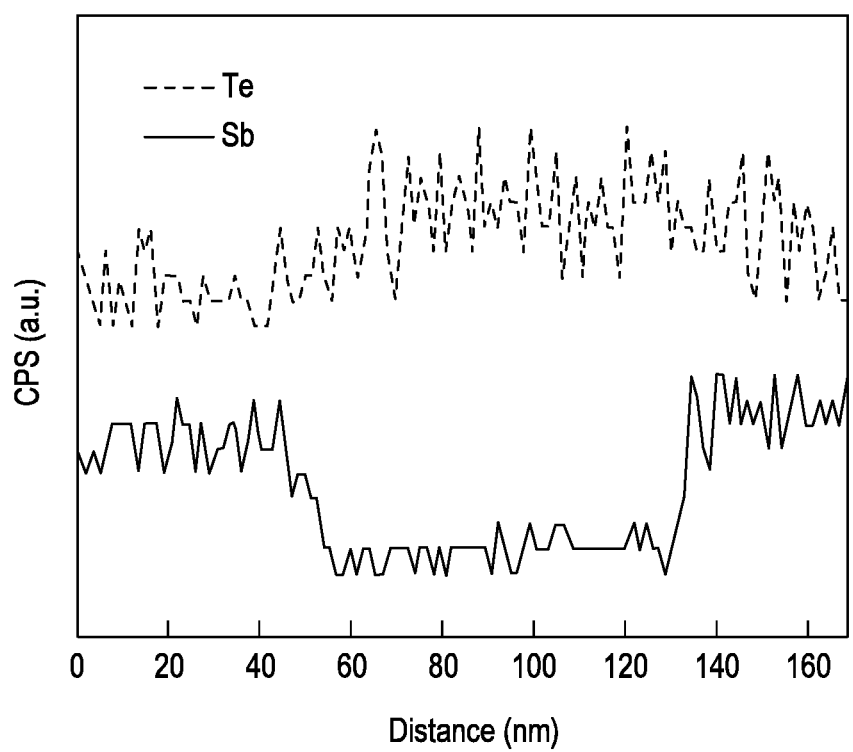
Figure 21C:
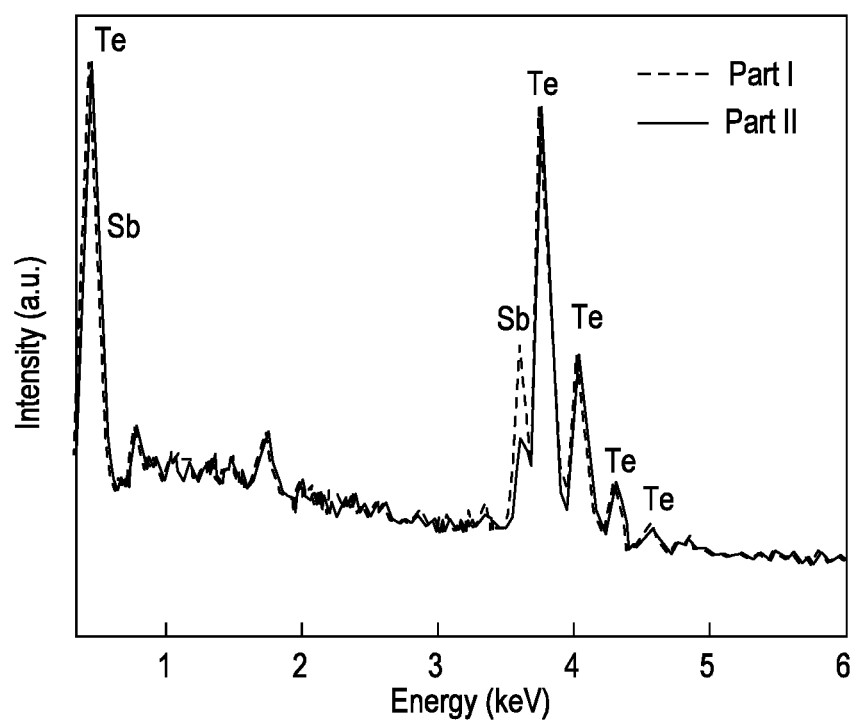

TEM and high-resolution TEM images of printed $Sb_2Te_3$—Te films are provided in FIG. 19C-19D. The Te precipitates are easily identified from the $Sb_2Te_3$ matrix as a result of the lattice mismatch. The printed 1D/2D composite is composed of $Sb_2Te_3$ nanoplates and Te nanorods. The Te second phase appears as substantially circular dots on the cross-section of the focused ion beam (FIB) milled film. The local EDS analysis and element line-scan (Table 7 and FIGS. 21A-21C) confirms the Te-rich phase of >85 at % Te. Here, the larger nanorods are believed to be formed during the sintering process. The room temperature carrier concentration and mobility of the $Sb_2Te_3$—Te films were determined to be $4.95 \times 10^{19}$ cm$^{-3}$ and 79.3 cm²V$^{-1}$ s$^{-1}$, respectively.

TABLE 7

| Position | Element | Weight % | Atomic % |
|---|---|---|---|
| I | Sb | 40.4 | 41.5 |
|  | Te | 59.6 | 58.5 |
| II | Sb | 14.7 | 15.3 |
|  | Te | 85.3 | 84.7 |

Figure 22A:
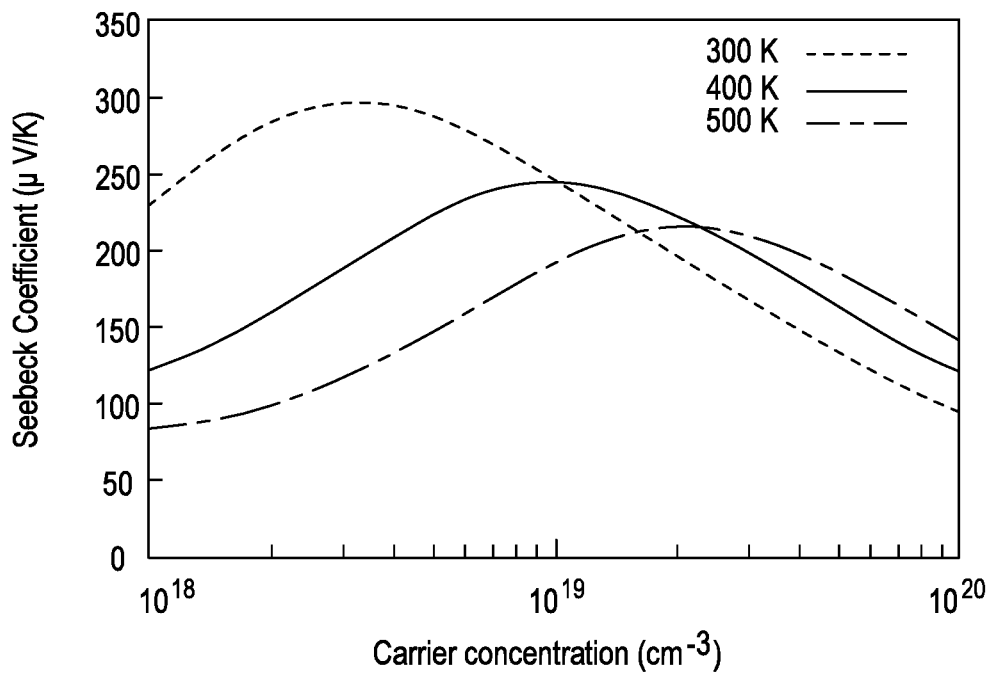
FIGS. 22A-22D show transport properties from Boltzmann transport calculations and carrier pocket visualization for bulk $Sb_2Te_3$.
Figure 22B:
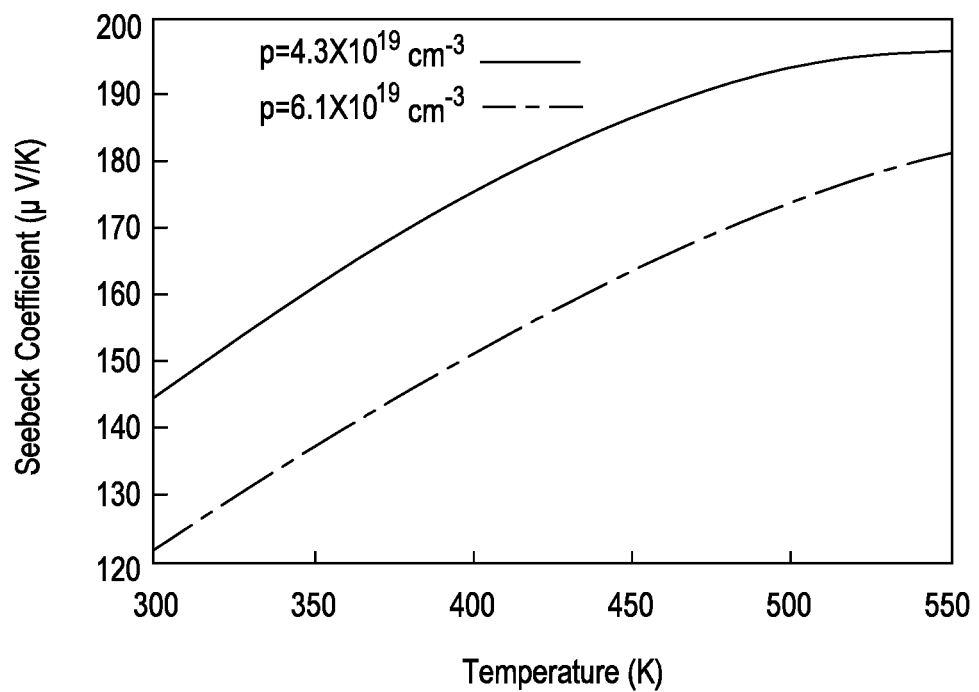
Figure 22C:
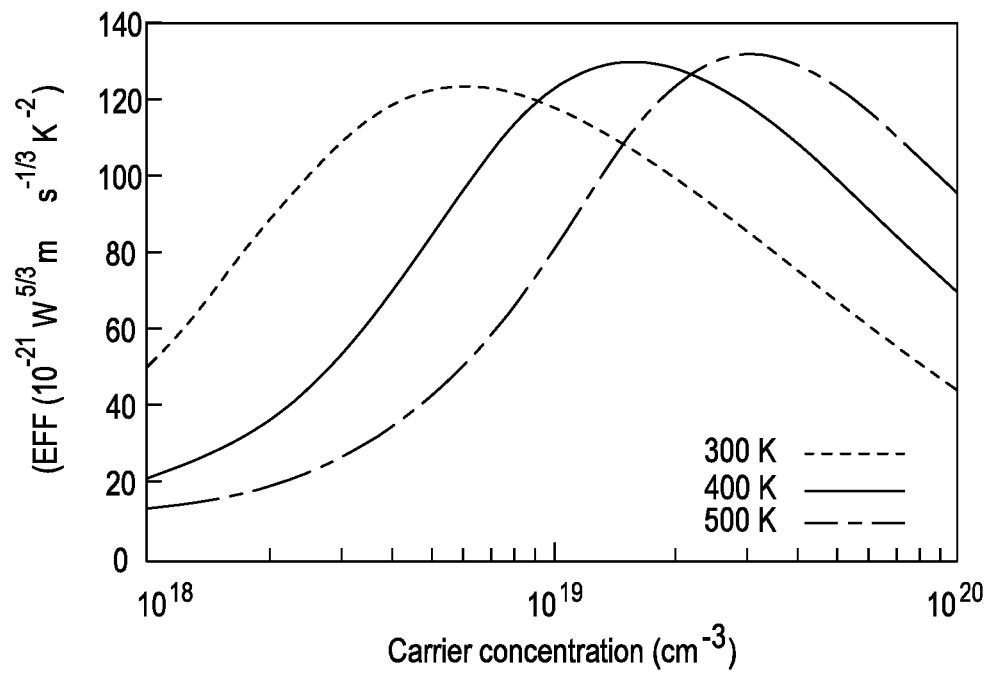
Figure 22D:
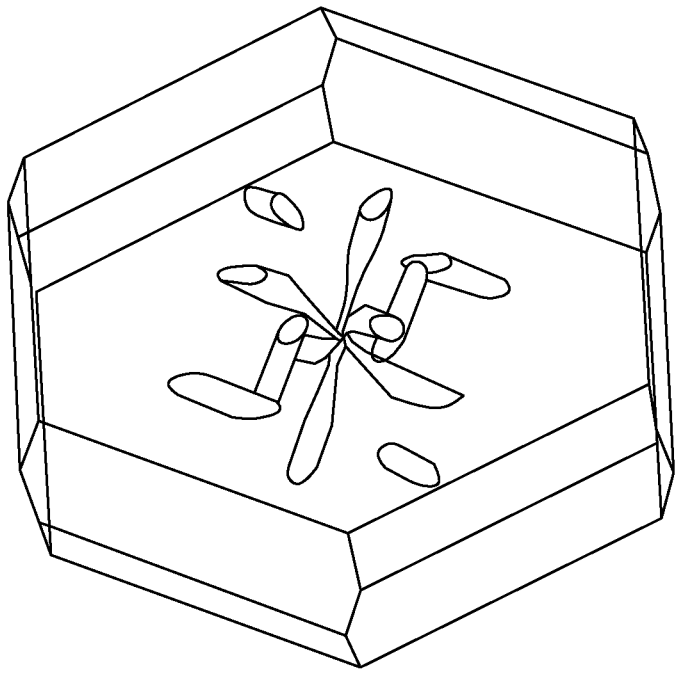

FIG. 22A shows Seebeck coefficient S as obtained from Boltzmann transport calculations as a function of carrier concentration p. The value of p can be estimated by comparing experimental values with the obtained curves. FIG. 22B shows the calculated S(T) for two carrier concentrations, specifically $4.3 \times 10^{19}$ cm$^{-3}$ and $6.1 \times 10^{19}$ cm$^{-3}$. These values were chosen to be consistent with the ambient temperature experimental S. As can be seen, the curve for $4.3 \times 10^{19}$ cm$^{-3}$ is close to the experimental data of FIG. 19A for the $Sb_2Te_3$—Te system, while the higher doping level curve compares well with the $Sb_2Te_3$ data in FIG. 16A. Note that the p in these theoretical curves is the chemical carrier concentration, which may not necessarily be the same as the Hall values due to the nonparabolic band structure. The similar temperature dependence of the calculated curves and the experimental data supports the inference that reduced doping level in the nanostructured $Sb_2Te_3$—Te leads to enhancement in S. The calculated electronic fitness function (EFF), shown in FIG. 22C measures the decoupling of S and σ through band structure effects, and is closely related to the PF. The EFF shows both high values and an increase with reduction in carrier concentration in the range where S is consistent with the experimental values. The EFF indicates that the nanostructured $Sb_2Te_3$—Te is close to optimum doping at 500 K. It is also noteworthy that the calculated values of the EFF are quite high, reaching $1.3 \times 10^{-19}$ W$^{5/3}$ ms$^{-1/3}$ K$^{-2}$ at 500 K. A value of $1.2 \times 10^{-19}$ W$^{5/3}$ ms$^{-1/3}$ K$^{-2}$ is obtained at 300 K, albeit at lower carrier concentration. These values are comparable to some of the best reported TE materials. Table 8 below shows performance characteristics of various other p-type films, near room temperature. The high EFF may be attributable at least in part to the topological insulator behavior of $Sb_2Te_3$, which leads to a highly nonparabolic band structure. This can be seen in the carrier pocket visualization of FIG. 22D. Here, there are multiple, highly anisotropic carrier pockets, favorable for high TE performance, and very different from the single spherical section characteristic of the isotropic parabolic band model.

TABLE 8

| Material | σ (10⁴ S/m) | S (μV/K) | S²σ (mW/mK²) |
|---|---|---|---|
| The Present $Sb_2Te_3$—Te | 6.3 | 147 | ~1.36 |
| PEDOT/$Bi_2Te_3$ | 4.8 | 168 | ~1.35 |
| Ag—$Sb_2Te_3$ | 3.5 | 103 | ~0.37 |
| $Bi_{0.5}Sb_{1.5}Te_3$ | 0.2 | 278 | ~0.18 |

TABLE 8-continued

| Material | $\sigma$ ($10^4$ S/m) | S ($\mu$V/K) | $S^2\sigma$ (mW/mK$^2$) |
| --- | --- | --- | --- |
| PANI/Te | 1.2 | 93 | ~0.10 |
| CuI/PET | 1.3 | 172 | ~0.38 |
| Doped CNT | ~17 | ~20 | ~0.7 |
| Ca$_3$Co$_4$O$_9$ | ~1.5 | ~125 | ~0.23 |

Figure 23A:
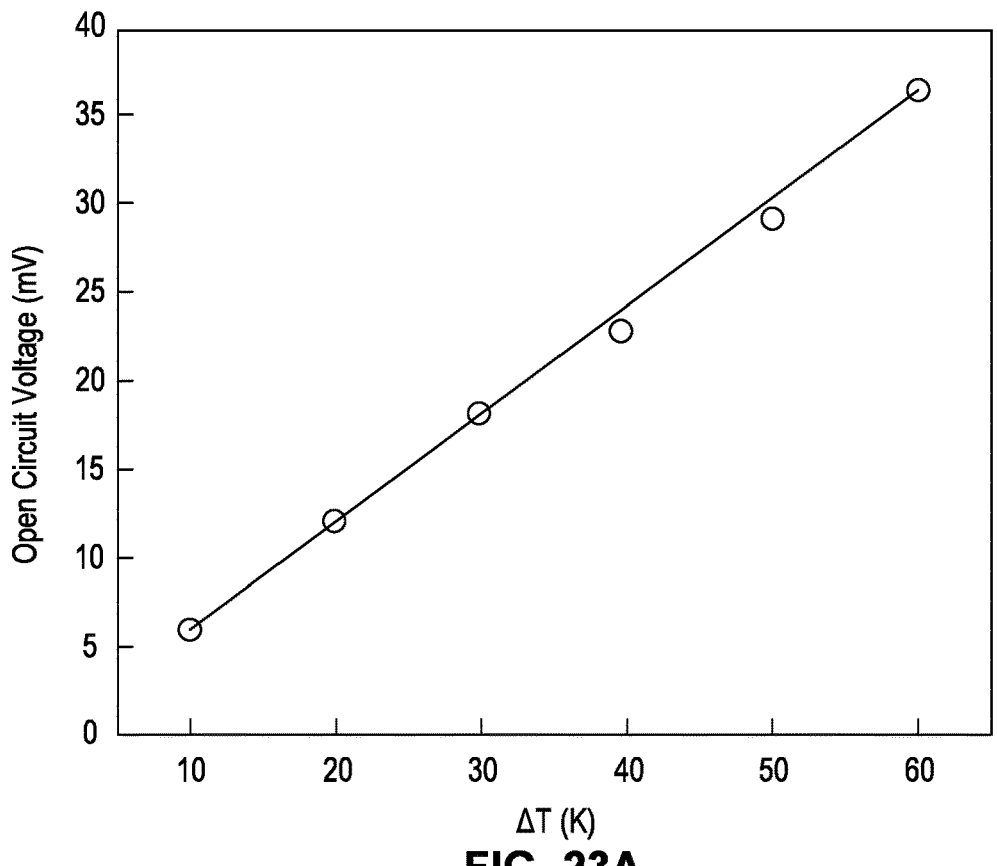
FIGS. 23A-23D show performance of a flexible TE device fabricated by 3D conformal aerosol jet printing using $Sb_2Te_3$ strips connected with Ag legs.
Figure 23B:
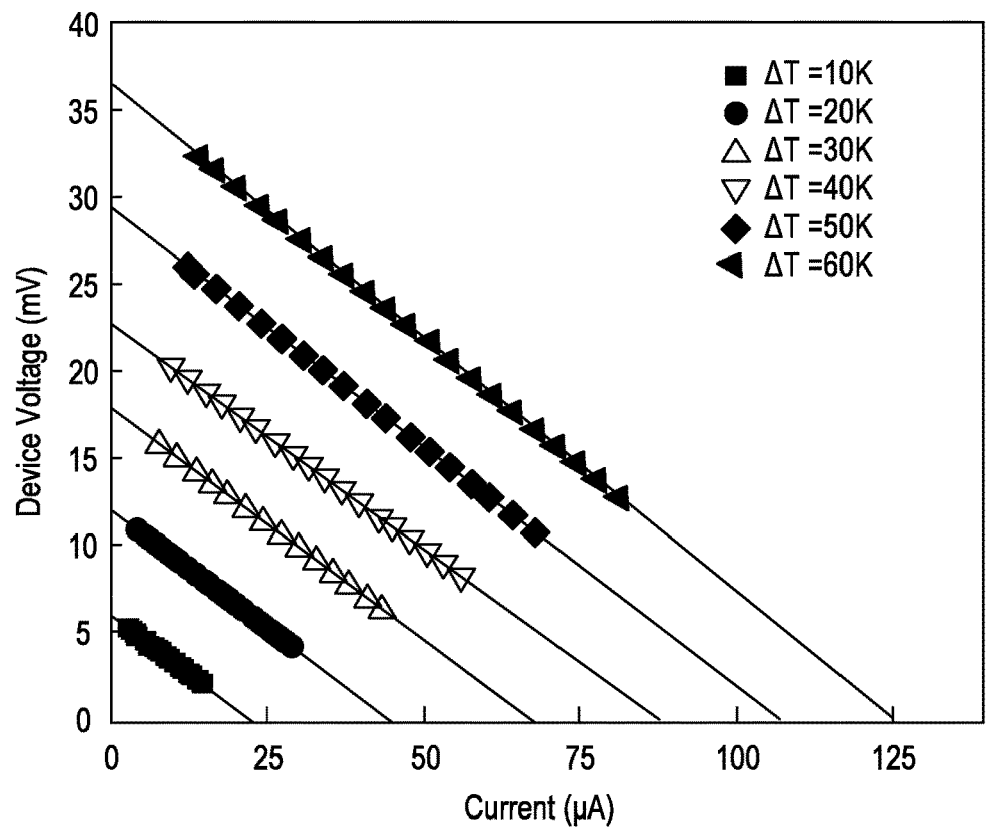
Figure 23C:
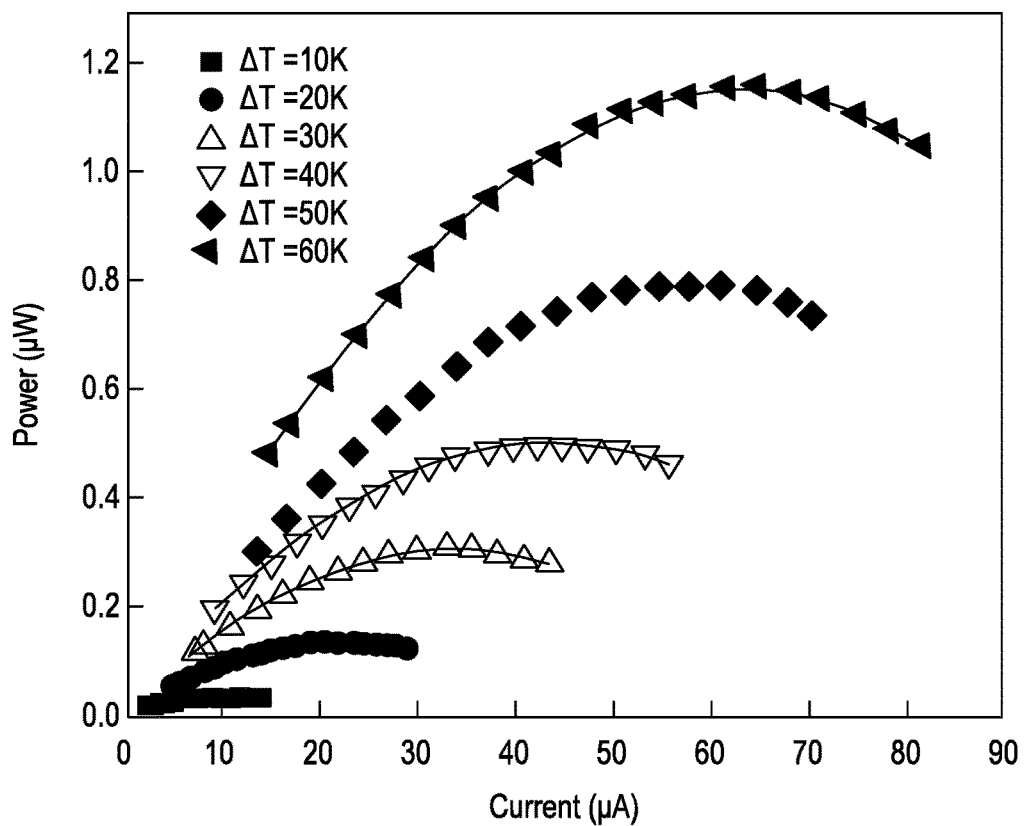
Figure 23D:
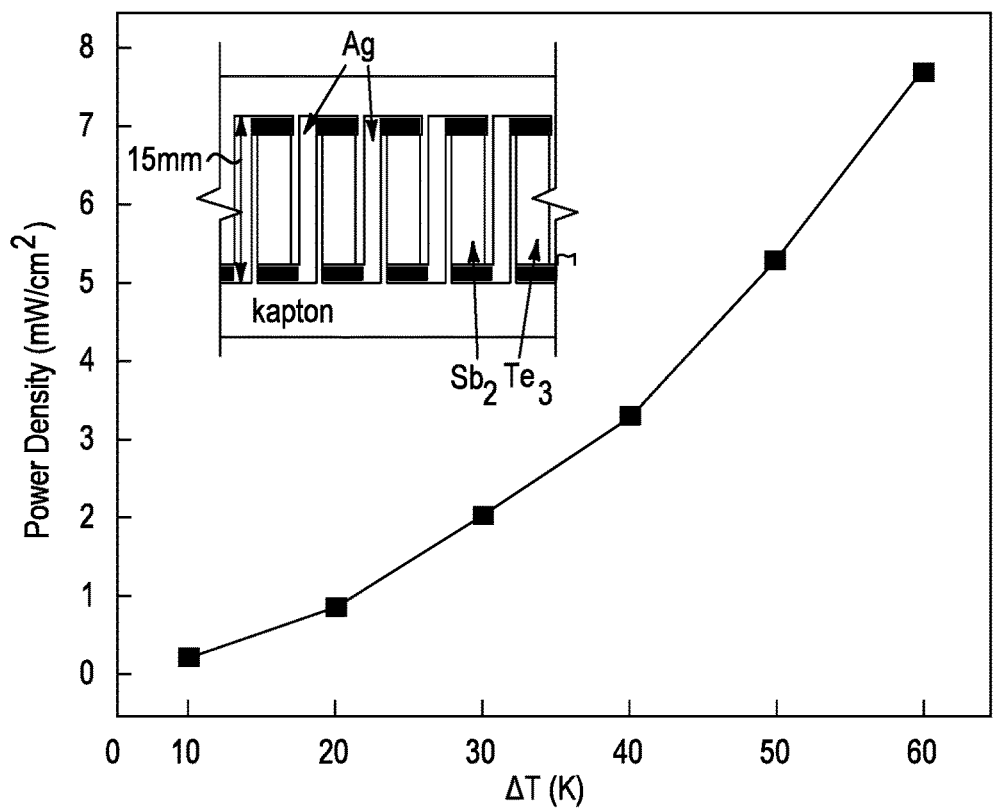
Figure 24:
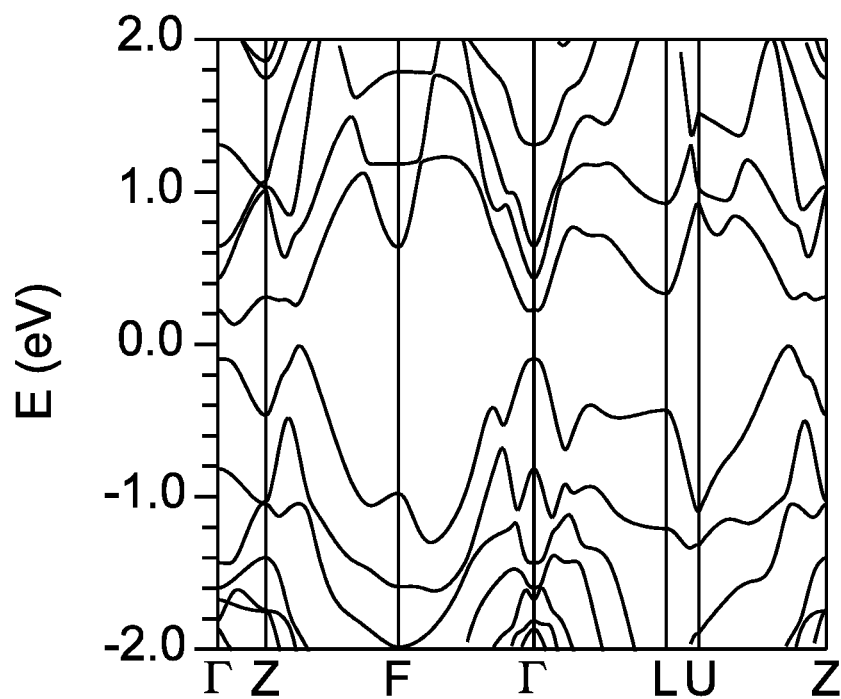
FIG. 24 shows band structure of $Sb_2Te_3$ showing a single parabolic band (SPB) model.

A flexible/wearable TE generator with aerosol jet printed Sb$_2$Te$_3$ films and Ag electrodes was fabricated to demonstrate the printed f-TEG for energy harvesting. The output voltage (FIG. 23B) and power (FIG. 23C) show great promise for the development of small-scale flexible/wearable TE generators, where the high PF of the printed TE films plays a significant role. FIG. 23A shows that the measured device open circuit voltage (Voc) increases linearly with temperature differential ($\Delta$T) of 60 K with only 4 TE elements. FIGS. 23B-23C show the device operating voltage and power output as a function of electrical current tested at different $\Delta$T values, respectively. A maximum power output of 1.15 $\mu$W was obtained with a $\Delta$T of 60 K, as shown in FIG. 23D. Here the power density was evaluated based on the total cross-sectional area of the four TE elements perpendicular to the heat flow direction. The high power density (e.g., at least 1 mW/cm$^2$, at least 1.1 mW/cm$^2$, or at least 1.2 mW/cm$^2$, such as 1.1 mW/cm$^2$ to 10 mW/cm$^2$) indicates that a compactly sized printed f-TEG would be sufficient to power a range of typical devices and sensors, fueled by a waste heat temperature differential of for example, at least 10 K, such as from 20 K to 60 K.

Creating functional TE materials with acceptable mechanical compliance while retaining competitive TE properties is a long-standing challenge. In the present disclosure, high-performance and flexible thermoelectric films were produced by aerosol jet printing Sb$_2$Te$_3$ nanoplates on flexible substrates. The power factor of printed Sb$_2$Te$_3$ films reaches 1.37 mW/mK$^2$ at around 300 K, with a competitive average power factor larger than 1.5 mW/mK$^2$ from 350 to 500 K. In addition, the present disclosure demonstrates a 1D/2D nanocomposite film (e.g., 1D Te nanorods and 2D Sb$_2$Te$_3$ nanoplates) that exhibits an ultrahigh peak power factor of 2.2 mW/mK$^2$ at 500 K, which is especially attractive for waste heat recovery applications at medium-temperature ranges. A flexible all-printed thermoelectric generator was demonstrated, achieving a competitive device power density of 7.65 mW/cm$^2$ with a temperature differential of 60 K. The aerosol jet printing technique not only provides enormous opportunities in scalable manufacturing of flexible TE devices for energy harvesting and cooling applications, but also can be readily applied to explore other device architectures for broad applications beyond thermoelectric devices.

IV. Examples

Example 1

Bi$_2$Te$_{2.7}$Se$_{0.3}$ nanoplates fabrication: In order to fabricate Bi$_2$Te$_{2.7}$Se$_{0.3}$ nanoplates, 2 mmol Bi(NO$_3$)$_3$, 2.7 mmol Na$_2$TeO$_3$ and 0.3 mmol SeO$_2$ were dissolved in 70 mL ethylene glycol (EG), 1.5 g NaOH was added with vigorous stirring, and followed by 0.5 g polyvinylpyrrolidone (PVP, Ms=40,000 g/mol) and refluxing the mixture solution at 185° C. with nitrogen protection. After the mixture cool down to room temperature, acetone was used to precipitate the fabricated Bi$_2$Te$_3$ nanoplates and then re-dissolve with ethanol. This process was repeated three times to remove any unreacted chemicals and ethylene glycol from the surface.

Bi$_2$Te$_{2.7}$Se$_{0.3}$ inks preparation and 3D aerosol jet printing: The Bi$_2$Te$_{2.7}$Se$_{0.3}$ nanoplates were dispersed in solution to form a stable ink to allow aerosol jet printing. The ink composition was optimized to achieve optimal film deposition and all-printed TE devices. The solvent or carrier for the Bi$_2$Te$_{2.7}$Se$_{0.3}$ ink was a mixture of ethylene glycol (EG), glycerol and ethanol with ratio of EG:Glycerol:Ethanol of 35:5:60 by weight.

After that, Bi$_2$Te$_{2.7}$Se$_{0.3}$ particles (15% by weight) were added, followed by a strong probe sonication (20 minutes) and bath sonication (30 minutes) at room temperature. High resolution (minimum 10 $\mu$m feature size) aerosol jet printing was used to print precise patterns with a printing speed of from 1 to 6 mm/s. The printer was digitally programmed with computer-aided design software (AutoCAD) for pattern formation, enhancing the flexibility for the design and manufacturing of all-printed TE devices.

Photonic sintering of Bi$_2$Te$_{2.7}$Se$_{0.3}$ films: Photonic sintering was performed using a Sinteron 2100 (Xenon Corp., USA) with a 107 mm Xenon spiral lamp. The S-2100 can be configured for maximum pulse durations of 3 ms with the sintering carried out in an ambient environment. The S-2100 can produce pulse energy ranging from 30 to 2850 Joules as well as a maximum pulse energy of 950 J/ms.

Characterizations: The synthesized Bi$_2$Te$_{2.7}$Se$_{0.3}$ nanoplates were analyzed by X-ray diffraction (XRD) using Cu K$\alpha$ radiation ($\lambda$=1.5418 Å, Bruker D2 Phaser). Transmission Electron Microscope (TEM) and High Resolution TEM techniques including the selected 12 area electron diffraction (SAED) images were performed using a JEM-2100 electron microscope. The morphology of all films was measured by the Scanning Electron Microscope Magellan 400 (FEI Company), with working voltage 15 KV and working of distance 4.5 mm.

Device fabrication and testing: In order to fabricate a thermoelectric device, four printed films were electrically connected in series using silver electrodes. The thermoelectric device was measured using a custom-built testing system with controlled hot-side and cold-side temperatures, and a variable resistor to match the TE device resistances in order to obtain the maximum power output.

Various performance characteristics relative to Example 1 are shown in the Figures and Tables and described in the detailed description section herein.

Example 2

Nanoparticle fabrication (Sb$_2$Te$_3$ and Sb$_2$Te$_3$—Te): To synthesize pure Sb$_2$Te$_3$, 70 ml ethylene glycol (EG) solution containing mixed antimony trichloride (SbCl$_3$, 6 mmol), tellurium dioxide (TeO$_2$, 9 mmol), sodium hydroxide (NaOH, 1.5 g), and polyvinylpyrrolidone (PVP, Ms of about 40000 g/mol, 0.8 g) were heated to 120° C. 10 ml hydrazine hydrate (N$_2$H$_4$) was swiftly injected. The mixture was maintained at 130° C. for 30 minutes, then heated to 155° C. under reflux for another 10 hours. The precipitates were collected by centrifugation at 5000 rpm, washed using ethanol, three times. To fabricate the Te-rich nanocomposite (Sb$_2$Te$_3$—Te), a nominal 10 at % excess of TeO$_2$ was added with the other conditions remaining the same.

Ink preparation and aerosol jet printing: The as-fabricated nanoplates were dispersed in solution to form a stable ink to allow aerosol jet printing (OPTOMEC AJP 300) using a pneumatic atomizer (PA). Normal inkjet printing has a strict requirement that viscosity be maintained in a range of 5-15 cps. Aerosol jet printing, on the other hand, can print ink with viscosities across a wider range, e.g., from 1-1000 cps, with different nanostructures, providing a versatile approach with high spatial resolution. In the present disclosure, the ink composition was formulated to provide excellent film deposition and all printed TE devices. The solvent or carrier for the $Sb_2Te_3$ ink was a mixture of ethylene glycol (EG), glycerol and ethanol with an EG:Glycerol:Ethanol ratio of 35:5:60 percent by weight. $Sb_2Te_3$ particles were added at a weight ratio of 20%, followed by a strong probe sonication (20 minutes) and bath sonication (30 minutes).

Silver conductive ink (PRELECT TPS 50G2) was purchased from CLARIANT, and mixed with deionized water at a volume ratio of 1:3 to prepare the Ag ink. Aerosol jet printing with ultrasonic atomizer (UA) was used to print the Ag electrodes. The printing parameters were as summarized in Table 5.

Sintering of as-printed film: After cold pressing at 15 MPa for 15 minutes, thermal sintering was performed. The films were pre-heated at 110° C. for 90 minutes to remove remaining solvent under an $N_2$ atmosphere, and then sintered at 400° C. for 1 hour with an increasing rate of 1.5° C./min, then decreased to 250° C. and held for another 2 hours. Finally, the samples were cooled down to room temperature (e.g., 20-25° C.).

Characterizations: The synthesized $Sb_2Te_3$ nanoplates were analyzed by X-ray diffraction (XRD) using Cu Kα radiation (λ=1.5418 Å, Bruker D2 Phaser). TEM and High Resolution TEM techniques including the selected area electron diffraction (SAED) images were performed using a JEM-2100 electron microscope. TEM specimens were prepared using focused ion beam (FIB) milling process, a FEI Helios FIB-SEM (FEI Company, Hillsboro, OR, USA) was used for serial sectioning and data collection. The morphology of all films (cross section and top-view) was measured by the Scanning Electron Microscope Magellan 400 (FEI Company), with a working voltage of 15 KV and a working distance of 4.5 mm.

Figure 25:
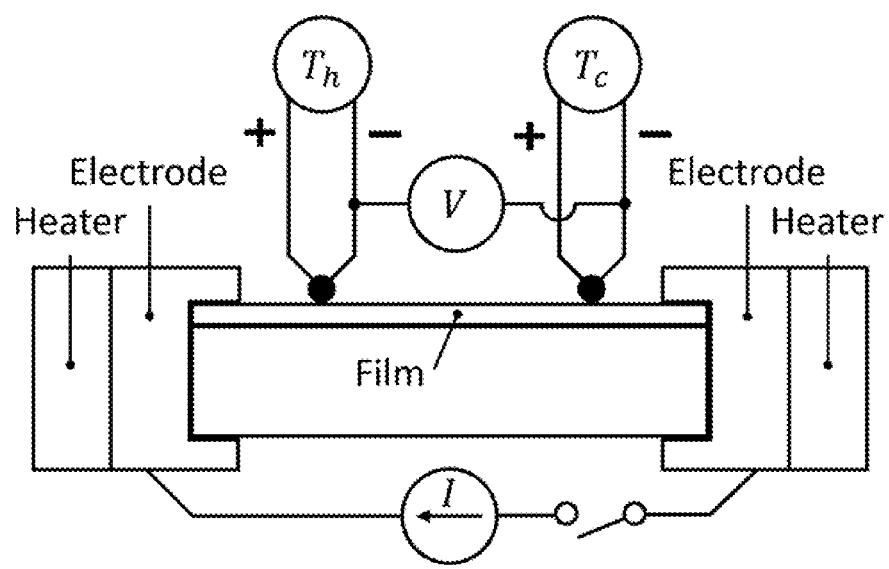
FIG. 25 schematically shows the experimental setup used for measuring Seebeck coefficient and electrical conductivity of the fabricated thin films.

Thermoelectric properties measurement: Seebeck coefficients were measured with a transient method wherein the temperature difference is increased from 1 to 5 K at approximately 0.5 K/min. Electrical conductivity was measured before Seebeck coefficient when temperatures are held at steady state with less than 0.05 K/min change in absolute temperature and in temperature difference. A schematic of the measurement setup is shown in FIG. 25. Seebeck coefficient and electrical conductivity are measured at the same time and temperature using the configuration shown in FIG. 25.

The film being tested is held to a dielectric support substrate with two electrodes through which current I is supplied for electrical conductivity measurement. Two thermocouples are brought into contact with the film and the measurement apparatus placed in a helium environment to improve thermal contact between the thermocouple tips and the film. On the other side of the electrodes are gradient heaters allowing precise control over the temperatures $T_h$ and $T_c$ and thus the temperature gradient $\Delta T=T_h-T_c$. Before measurement begins, the temperature gradient across the film is prescribed to be $\Delta T=1K$. When all temperatures are at steady state (less than 0.05 K/min change in absolute temperature and in temperature gradient $\Delta T$) the current switch is closed and current is sent through the sample. The voltage is measured across the negative leads of the thermocouples. This was done for five equally spaced current values. The sample resistance R is the slope of the best fit line through the V/I data and the conductivity is then calculated as σ=L/RA, where L is the distance between the thermocouple tips and A is the cross-sectional area of the sample.

Seebeck coefficient measurement begins by opening the current switch and slowly ramping the temperature gradient $\Delta T$ from 1K to about 5 K while recording $\Delta T$ and voltage difference $\Delta V$ across the negative leads of the thermocouples with alternating measurements equally spaced in time. The negative of the slope of the best fit line through the $\Delta V/\Delta T$ data gives the Seebeck coefficient relative to the material comprising the negative lead of the thermocouple. The absolute Seebeck coefficient of the sample is obtained by adding the absolute Seebeck coefficient of the negative thermocouple wire material to the measured sample relative Seebeck coefficient. The measurement error of the set-up was less than 2% for electrical conductivity and less than 3% for the Seebeck coefficient, respectively. The instrument was calibrated using a standard constantan sample of known properties.

Transport and electronic structure calculations: Density functional calculations were performed for bulk $Sb_2Te_3$ with the Perdew-Burke-Ernzerhof Generalized Gradient Approximation (PBE-GGA). The calculations were done using the general potential linearized augmented planewave method as implemented in the WIEN2k code. Experimental lattice parameters were used, and the non-symmetry constrained atomic positions were determined by total energy minimization. Transport calculations were done using the BoltzTraP code with the constant scattering time approximation. The electronic fitness function was then obtained from the transport data using the transM code.

Various performance characteristics relative to Example 2 are shown in the Figures and Tables and described in the detailed description section herein.

Features from any of the disclosed embodiments or claims may be used in combination with one another, without limitation. It will also be appreciated that the present claimed invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

The invention claimed is:

1. An aerosol jet printable ink composition comprising:
a carrier including two different polyols and a lower alcohol having 1-4 carbon atoms;
thermoelectric nanoparticles dispersed in the carrier; and
a surfactant for preventing or minimizing agglomeration of the nanoparticles, wherein the first polyol and second polyol being present at a weight ratio of from 2:1 to 10:1.

2. The ink composition as recited in claim 1, wherein the thermoelectric nanoparticles comprise a chalcogenide.

3. The ink composition as recited in claim 2, wherein the chalcogenide comprises Te.

4. The ink composition as recited in claim 1, wherein the thermoelectric nanoparticles comprise a thermoelectric material comprising Bi, Te, and Se, or a thermoelectric material comprising Sb and Te.

5. The ink composition as recited in claim 1, wherein the thermoelectric nanoparticles comprise at least one of $Bi_2Te_{2.7}SeO_3$ or $Sb_2Te_3$.

6. The ink composition as recited in claim 1, wherein the thermoelectric nanoparticles comprise an $Sb_2Te_3$-Te composite including $Sb_2Te^3$ nanoplates and Te nanorods.

7. The ink composition as recited in claim 1, wherein the carrier comprises ethylene glycol, glycerol, and ethanol.

8. The ink composition as recited in claim 1, wherein the two different polyols comprises from 20-60% by weight of the carrier, and the alcohol comprises from 40-80% by weight of the carrier.

9. The ink composition as recited in claim 1, wherein the thermoelectric nanoparticles comprise nanoplates.

10. The ink composition as recited in claim 1, wherein the carrier comprises at least 60%, at least 65%, at least 70%, at least 80%, or from 80-90% by weight of the ink composition.

11. The ink composition as recited in claim 1, wherein the nanoparticles comprise up to 40%, up to 35%, up to 30%, up to 25%, up to 20%, or from 10-20% by weight of the ink composition.

12. The ink composition as recited in claim 1, wherein the surfactant comprises polyvinylpyrrolidone.

13. The ink composition as recited in claim 1, wherein the ink composition is shelf-stable for at least 3 months, or at least 6 months.

14. An aerosol jet printable ink composition comprising:
a liquid carrier including at least one polyol and a lower alcohol having 1-4 carbon atoms;
thermoelectric nanoparticles dispersed in the carrier; and
a surfactant for preventing or minimizing agglomeration of the nanoparticles, wherein the at least one polyol comprises from 20-60% by weight of the carrier, and the alcohol comprises from 40-80% by weight of the carrier.

15. An aerosol jet printable ink composition comprising:
a carrier including at least one polyol and a lower alcohol having 1-4 carbon atoms, wherein the carrier comprises at least 60% by weight of the ink composition;
thermoelectric nanoparticles dispersed in the carrier; and
a surfactant for preventing or minimizing agglomeration of the nanoparticles.

16. The ink composition as recited in claim 1, wherein the composition, once sintered using photonic sintering with intense pulsed light, results in a film that exhibits an electrical conductivity value on the order of at least $1 \times 10^4$ S/m.

17. The ink composition as recited in claim 15, wherein the carrier comprises at least 65% by weight of the ink composition.

18. The ink composition as recited in claim 15, wherein the carrier comprises at least 70% by weight of the ink composition.

19. The ink composition as recited in claim 15, wherein the carrier comprises at least 80% by weight of the ink composition.

20. The ink composition as recited in claim 15, wherein the carrier comprises from 80-90% by weight of the ink composition.

21. The ink composition as recited in claim 16, wherein the thermoelectric nanoparticles comprise a chalcogenide.

22. The ink composition as recited in claim 16, wherein the thermoelectric nanoparticles comprise a thermoelectric material comprising Bi, Te, and Se, or a thermoelectric material comprising Sb and Te.

23. The ink composition as recited in claim 16, wherein the thermoelectric nanoparticles comprise at least one of $Bi_2Te_{2.7}SeO_3$ or $Sb_2Te_3$.

24. The ink composition as recited in claim 1, wherein the thermoelectric nanoparticles comprise an $Sb_2Te_3$-Te composite including $Sb_2Te_3$ nanoplates and Te nanorods.

25. The ink composition as recited in claim 15, wherein the carrier comprises two different polyols, the first polyol and second polyol being present at a weight ratio of from 2:1 to 10:1.

26. The ink composition as recited in claim 15, wherein the carrier comprises ethylene glycol, glycerol, and ethanol.

27. The ink composition as recited in claim 15, wherein the at least one polyol comprises from 20-60% by weight of the carrier, and the alcohol comprises from 40-80% by weight of the carrier.

28. The ink composition as recited in claim 15, wherein the nanoparticles comprise up to 40% by weight of the ink composition.

29. The ink composition as recited in claim 15, wherein the nanoparticles comprise up to 35% by weight of the ink composition.

30. The ink composition as recited in claim 15, wherein the nanoparticles comprise up to 30% by weight of the ink composition.

31. The ink composition as recited in claim 15, wherein the nanoparticles comprise up to 25% by weight of the ink composition.

32. The ink composition as recited in claim 15, wherein the nanoparticles comprise up to 20% by weight of the ink composition.

33. The ink composition as recited in claim 15, wherein the nanoparticles comprise from 10-20% by weight of the ink composition.

34. The ink composition as recited in claim 15, wherein the surfactant comprises polyvinylpyrrolidone.

35. The ink composition as recited in claim 1, wherein the ink composition, once sintered using photonic sintering with intense pulsed light, results in a film that demonstrates a room temperature power factor of at least 500 $mWm^{-1}K^{-2}$.

36. The ink composition as recited in claim 1, wherein the ink composition, once sintered using photonic sintering with intense pulsed light, results in a flexible film, such that the flexible film exhibits little or no change in electrical conductivity or resistivity or power factor after 500 bending cycles at a bending radius from 1 to 10 mm.

37. The ink composition as recited in claim 1, wherein the ink composition, once sintered using photonic sintering with intense pulsed light, results in a film that can be 3D printed onto any 3D conformal surface.

* * * * *